United States Patent
Moon et al.

(10) Patent No.: US 12,520,645 B2
(45) Date of Patent: Jan. 6, 2026

(54) DISPLAY DEVICE AND METHOD FOR MANUFACTURING THE SAME

(71) Applicant: SAMSUNG DISPLAY CO., LTD., Yongin-si (KR)

(72) Inventors: Su Mi Moon, Yongin-si (KR); Sin Chul Kang, Yongin-si (KR); Jae Woong Kang, Yongin-si (KR); Won Sik Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 769 days.

(21) Appl. No.: 17/786,952

(22) PCT Filed: Nov. 17, 2020

(86) PCT No.: PCT/KR2020/016161
§ 371 (c)(1),
(2) Date: Jun. 17, 2022

(87) PCT Pub. No.: WO2021/125574
PCT Pub. Date: Jun. 24, 2021

(65) Prior Publication Data
US 2023/0045654 A1    Feb. 9, 2023

(30) Foreign Application Priority Data
Dec. 18, 2019  (KR) .................. 10-2019-0169912

(51) Int. Cl.
*H10H 29/14* (2025.01)
*H10H 20/01* (2025.01)
(Continued)

(52) U.S. Cl.
CPC .......... *H10H 29/142* (2025.01); *H10H 20/01* (2025.01); *H10H 20/821* (2025.01);
(Continued)

(58) Field of Classification Search
CPC .......................... H10H 29/142; H01L 25/167
See application file for complete search history.

(56) References Cited

U.S. PATENT DOCUMENTS

| | | |
|---|---|---|
| 9,112,112 B2 | 8/2015 | Do et al. |
| 9,773,761 B2 | 9/2017 | Do |

(Continued)

FOREIGN PATENT DOCUMENTS

| | | |
|---|---|---|
| KR | 10-1244926 | 3/2013 |
| KR | 10-1490758 | 2/2015 |

(Continued)

OTHER PUBLICATIONS

International Search Report, with English translation, corresponding to International Application No. PCT/KR2020/016161 dated Feb. 25, 2021.

(Continued)

*Primary Examiner* — Erik Kielin
(74) *Attorney, Agent, or Firm* — Womble Bond Dickinson (US) LLP

(57) ABSTRACT

A display device includes transistors disposed on a substrate, a first protective layer covering the transistors, conductive patterns disposed on the first protective layer, a second protective layer disposed on the conductive patterns, first and second electrodes disposed on the second protective layer, at least one light emitting disposed between the first and second electrodes, and a first contact electrode disposed on the first electrode and contacting an end of at least one light emitting element, and a second contact electrode disposed on the second electrode and contacting another end of the at least one light emitting element. The conductive patterns include first and second conductive patterns respectively overlapping the first and second electrodes. The first electrode is connected to the first conductive pattern. The (Continued)

second protective layer includes an opening hole exposing a portion of the second conductive pattern.

26 Claims, 23 Drawing Sheets

(51) Int. Cl.
    *H10H 20/821*     (2025.01)
    *H10H 20/831*     (2025.01)
    *H10H 20/84*     (2025.01)

(52) U.S. Cl.
    CPC .......... *H10H 20/831* (2025.01); *H10H 20/84* (2025.01); *H10H 20/032* (2025.01)

(56) References Cited

U.S. PATENT DOCUMENTS

| | | |
|---|---|---|
| 10,269,779 B2 | 4/2019 | Lu |
| 10,622,414 B2 | 4/2020 | Kim et al. |
| 10,784,246 B2 | 9/2020 | Do et al. |
| 10,818,647 B2 | 10/2020 | Kim et al. |
| 10,943,947 B2 | 3/2021 | Im et al. |
| 11,069,726 B2 | 7/2021 | Kim et al. |
| 2019/0115513 A1 | 4/2019 | Im et al. |
| 2021/0242380 A1* | 8/2021 | Kim ..................... H10H 20/857 |

FOREIGN PATENT DOCUMENTS

| | | |
|---|---|---|
| KR | 10-2017-0142022 | 12/2017 |
| KR | 10-2018-0007025 | 1/2018 |
| KR | 10-1814104 | 1/2018 |
| KR | 10-2019-0024197 | 3/2019 |
| KR | 10-2019-0095638 | 8/2019 |
| KR | 10-2019-0121894 | 10/2019 |
| KR | 10-2019-0124359 | 11/2019 |
| WO | WO-2019208880 A1 * | 10/2019 ......... H01L 25/0753 |

OTHER PUBLICATIONS

Written Opinion, with English translation, corresponding to International Application No. PCT/KR2020/016161, dated Feb. 25, 2021.

Korean Notice of Allowance dated Mar. 10, 2025, in Korean Patent Application No. 10-2019-0169912.

* cited by examiner

DISPLAY DEVICE AND METHOD FOR MANUFACTURING THE SAME

CROSS-REFERENCE TO RELATED APPLICATION(S)

This application is a national entry of International Application No. PCT/KR2020/016161, filed on Nov. 17, 2020, which claims under 35 U.S.C. § 119(a) and 365(b) priority to and benefits of Korean Patent Application No. 10-2019-0169912, filed on Dec. 18, 2019 in the Korean Intellectual Property Office, the entire contents of which are incorporated herein by reference.

BACKGROUND

1. Technical Field

Various embodiments relate to a display device and a method of manufacturing the same.

2. Description of the Related Art

The importance of a display device is increasing with the development of multimedia. Accordingly, various types of display devices such as an organic light emitting display (OLED) and a liquid crystal display (LCD) are used.

A device for displaying an image of the display device may include a display panel such as an organic light emitting display panel or a liquid crystal display panel. The light emitting display panel may include a light emitting element. Examples of a light emitting diode (LED) may include an organic light emitting diode (OLED) using an organic material such as a fluorescent material, and an inorganic light emitting diode using an inorganic material as a fluorescent material.

The inorganic light emitting diode using an inorganic semiconductor as the fluorescent material is durable even in a high-temperature environment, and is higher in efficiency of blue light compared to the organic light emitting diode. Furthermore, a transfer method using a dielectrophoresis (DEP) method has been developed to overcome the limitations of a manufacturing process for a an inorganic light emitting diode element. Thus, research into inorganic light emitting diodes having excellent durability and efficiency compared to the organic light emitting diode is continuously made.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device including electrodes having different widths, and a light emitting element disposed between the electrodes.

An object of the disclosure is to provide a display device in which the light emitting elements disposed between the electrodes have a uniform distribution.

The disclosure is not limited to the above-described objects, and other objects will be clearly understood by those skilled in the art from the following description.

A display device in accordance with an embodiment includes transistors disposed on a substrate; a first protective layer disposed on the transistors and covering the transistors; conductive patterns disposed on the first protective layer; a second protective layer disposed on the conductive patterns; a first electrode and a second electrode disposed on an identical layer on the second protective layer, and spaced apart from each other; at least one light emitting element disposed between the first electrode and the second electrode; a first contact electrode disposed on the first electrode and electrically contacting an end of the at least one light emitting element; and a second contact electrode disposed on the second electrode and electrically contacting another end of the at least one light emitting element. The conductive patterns include a first conductive pattern overlapping the first electrode in a thickness direction of the display device, and a second conductive pattern overlapping the second electrode in the thickness direction of the display device. The first electrode is electrically connected to the first conductive pattern through a contact hole passing through the second protective layer. The second protective layer includes an opening hole exposing at least a portion of the second conductive pattern.

The first electrode may directly contact the first conductive pattern through the contact hole. The second electrode may be insulated from the second conductive pattern.

The second conductive pattern may be directly connected to a source electrode or a drain electrode of at least one of the transistors through another contact hole passing through the first protective layer.

A first power voltage may be applied to the first electrode, and a second power voltage that is a higher potential power voltage than the first power voltage may be applied to the second electrode.

The first electrode and the second electrode each may extend in a first direction. An extension length of the first electrode may be greater than an extension length of the second electrode.

The second electrode electrically connected to the first electrode by the at least one light emitting element may include second electrodes. The opening hole may be disposed between the second electrodes.

The display device may further include a first bank disposed between the second protective layer and the first electrode; and a second bank disposed between the second protective layer and the second electrode. The first bank and the second bank each may have a shape protruding from an upper surface of the second protective layer in the thickness direction.

The first electrode may cover the first bank. The second electrode may cover the second bank.

The opening hole may be adjacent to the second bank.

The opening hole may pass through the second bank.

The display device may further include a first island electrode, the first island electrode, the first electrode, and the second electrode may be disposed on an identical layer and the first island electrode may be disposed between the first electrode and the second electrode.

The at least one light emitting element may be disposed between the first electrode and the first island electrode and between the first island electrode and the second electrode.

A difference between a number of the at least one light emitting element disposed between the first electrode and the first island electrode and a number of the at least one light emitting element disposed between the first island electrode and the second electrode may be less than about 5%.

The conductive patterns may further include a third conductive pattern overlapping the first island electrode in the thickness direction of the display device.

The second protective layer may further include another opening hole exposing at least a portion of the third conductive pattern. The first island electrode may be insulated from the third conductive pattern.

The display device may further include a second island electrode, the second island electrode, the first electrode, the second electrode, and the first island electrode may be disposed on an identical layer and the second island electrode may be disposed between the first island electrode and the second electrode.

A width of each of the first electrode and the second electrode may be less than a width of each of the first island electrode and the second island electrode.

The light emitting elements may be electrically connected in series and parallel.

An embodiment provides a method of manufacturing a display device including forming banks spaced apart from each other on a protective layer; forming an opening hole to expose at least a portion of each of the conductive patterns; forming electrode materials on the banks such that the electrode materials electrically contact the conductive patterns through the opening hole, and forming an insulating material on the electrode materials; and aligning light emitting elements on the insulating material such that the light emitting elements are disposed between the conductive patterns.

The method may further include forming a separation area separating a part of the electrode materials into parts.

The separation area may overlap the opening hole in a thickness direction of the display device.

The method may further include forming an insulating layer to cover the opening hole.

In forming the separation area, the part of the separated electrode materials may not electrically contact the conductive patterns, and another part of the electrode materials that are not separated may electrically contact the conductive patterns.

The electrode materials may include a first electrode material, a second electrode material, a third electrode material, and a fourth electrode material which may extend in a first direction. The conductive patterns may include a first conductive pattern overlapping the first electrode material in the thickness direction of the display device, a second conductive pattern overlapping the second electrode material in the thickness direction of the display device, a third conductive pattern overlapping the third electrode material in the thickness direction of the display device, and a fourth conductive pattern overlapping the fourth electrode material in the thickness direction of the display device.

In aligning the light emitting elements, the light emitting elements may be aligned between the first conductive pattern and the second conductive pattern, between the second conductive pattern and the third conductive pattern, and between the third conductive pattern and the fourth conductive pattern. A difference between a number of light emitting elements aligned between the first conductive pattern and the second conductive pattern, a number of light emitting elements aligned between the second conductive pattern and the third conductive pattern, and a number of light emitting elements aligned between the second conductive pattern and the third conductive pattern may be less than about 5%.

In aligning the light emitting elements, a difference between capacitances between the first conductive pattern and the second conductive pattern, between the second conductive pattern and the third conductive pattern, and between the third conductive pattern and the fourth conductive pattern may be less than about 5%.

In aligning the light emitting elements, an AC voltage may be applied to the first conductive pattern and the third conductive pattern, and a ground voltage may be applied to the second conductive pattern and the fourth conductive pattern.

Details of various embodiments are included in the detailed descriptions and drawings.

In embodiments, light emitting elements disposed between electrodes may have a uniform distribution.

The effects of the disclosure are not limited by the foregoing, and other various effects are included herein.

BRIEF DESCRIPTION OF DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
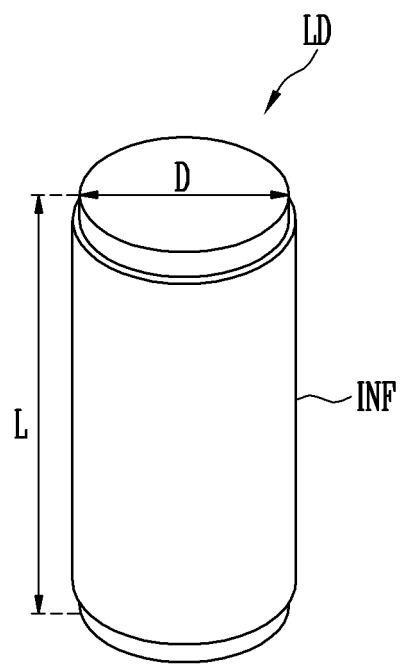
FIGS. 1 and 2 are a schematic perspective view and a schematic cross-sectional view illustrating a light emitting element in accordance with an embodiment.

Advantages and features of the disclosure, and methods for achieving the same will be clear with reference to embodiments described in detail together with the accompanying drawings. The disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the disclosure will also be defined by the appended claims.

In the drawings, sizes, thicknesses, ratios, and dimensions of the elements may be exaggerated for ease of description and for clarity. Like numbers refer to like elements throughout.

It will be understood that in case that an element or a layer is referred to as being "on" another element or a layer, it can be directly on, connected to, or coupled to the other element or the layer, or one or more intervening elements or layers may be present. Like reference numerals refer to like elements throughout. It will be understood that the terms "connected to" or "coupled to" may include a physical or electrical connection or coupling.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

In the disclosure, the singular forms are intended to include the plural forms as well, unless the context clearly indicates otherwise. For example, as used herein, the singular forms, "a," "an," and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings. In the drawings, same or similar reference numerals are used to designate the same or similar elements.

Figure 2:
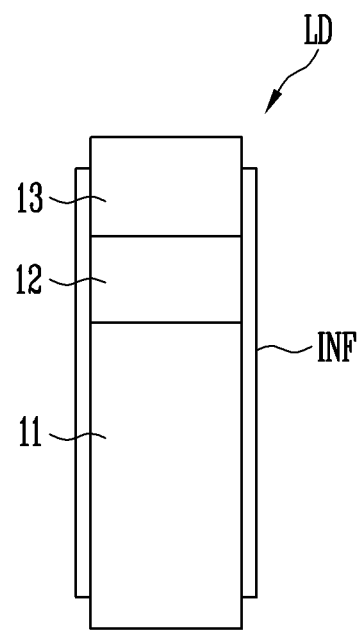

FIGS. 1 and 2 are a schematic perspective view and a schematic cross-sectional view illustrating a light emitting element in accordance with an embodiment. Although a rod-type light emitting element LD having a cylindrical shape is illustrated in FIGS. 1 and 2, the type and/or shape of the light emitting element LD according to the disclosure are not limited thereto and may also include shapes substantial to the shapes.

Referring to FIGS. 1 and 2, the light emitting element LD may include a first conductive electrode layer 11, a second conductive electrode layer 13, and an active layer 12 interposed between the first and second conductive electrode layers 11 and 13. For example, the light emitting element LD may be formed of a stacked body formed by successively stacking the first conductive electrode layer 11, the active layer 12, and the second conductive electrode layer 13 in one direction or in a direction.

In an embodiment, the light emitting element LD may be provided in the form of a rod extending in one direction or in a direction. The light emitting element LD may have one end or an end and a remaining end with respect to one direction or in a direction.

In an embodiment, one of the first and second conductive electrode layers 11 and 13 may be disposed on the one end or an end of the light emitting element LD, and the other of the first and second conductive electrode layers 11 and 13 may be disposed on the remaining end of the light emitting element LD.

In an embodiment, the light emitting element LD may be a rod-type light emitting diode manufactured in the form of a rod. Here, the term "rod-like shape" embraces a rod-like shape and a bar-like shape such as a cylindrical shape and a prismatic shape that is longer in a longitudinal direction than in a width direction (for example, to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanoscale to the microscale, for example, a diameter D and/or a length L ranging from the nanoscale to the microscale. However, the size of the light emitting element LD is not limited thereto. For example, the size of the light emitting element LD may be changed in various ways depending on design conditions of various devices, for example, a display device, which employs, as a light source, a light emitting device using a light emitting element LD.

The first conductive electrode layer 11 may include at least one n-type semiconductor material. For instance, the first conductive electrode layer 11 may include an n-type semiconductor material which may include any one semiconductor material of InAlGaN, GaN, AlGaN, InGaN, AlN, and InN, and is doped with a first conductive dopant such as Si, Ge, or Sn. However, the material forming the first conductive electrode layer 11 is not limited thereto, and the first conductive electrode layer 11 may be formed of various other materials.

The active layer 12 may be disposed on the first conductive electrode layer 11 and have a single or multiple quantum well structure. In an embodiment, a cladding layer (not shown) doped with a conductive dopant may be formed over and/or under or below the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If a voltage of a threshold voltage or more is applied between the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting devices as well as a pixel of the display device.

The second conductive electrode layer 13 may be disposed on the active layer 12 and include a semiconductor material having a type different from that of the first conductive electrode layer 11. For example, the second conductive electrode layer 13 may include at least one p-type semiconductor material. For instance, the second conductive electrode layer 13 may include a p-type semiconductor material which may include any one semiconductor material of InAlGaN, GaN, AlGaN, InGaN, AlN, and InN, and is doped with a second conductive dopant such as Mg. However, the material forming the second conductive electrode layer 13 is not limited thereto, and the second conductive electrode layer 13 may be formed of various other materials.

In an embodiment, the light emitting element LD may further include an insulating film INF provided on the surface of the light emitting element LD. In an embodiment, the insulating film INF may be formed on the surface of the light emitting element LD to enclose an outer circumferential surface of at least the active layer 12, and may further enclose one area or an area of each of the first and second conductive electrode layers 11 and 13. Here, the insulating film INF may allow the opposite ends of the light emitting element LD that have different polarities to be exposed to the outside. For example, the insulating film INF may expose one end or an end of each of the first and second conductive electrode layers 11 and 13 that are disposed on the respective opposite ends of the light emitting element LD with respect to the longitudinal direction, for example, may allow two surfaces (for example, upper and lower surfaces) of the cylinder to be exposed rather than covering the two surfaces.

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but the disclosure is not limited thereto. In other words, the material that forms the insulating film INF is not limited to a particular material, and the insulating film INF may be formed of various insulating materials within the spirit and the scope of the disclosure.

In an embodiment, the light emitting element LD may further include additional other components as well as the first conductive electrode layer 11, the active layer 12, the second conductive electrode layer 13, and/or the insulating film INF. For example, the light emitting element LD may further include at least one fluorescent layer, at least one active layer, at least one semiconductor material and/or at least one electrode layer disposed on one end or an end of the first conductive electrode layer 11, the active layer 12, and/or the second conductive electrode layer 13.

Figure 3:
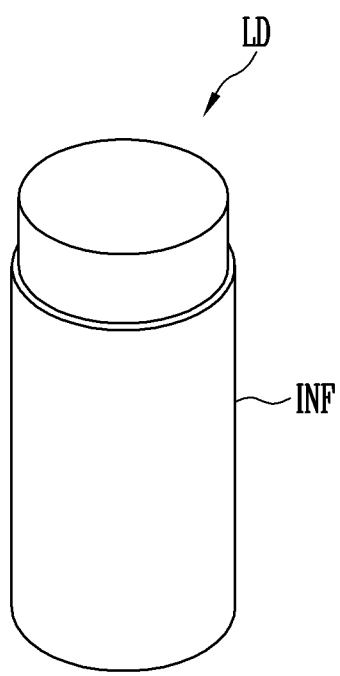
FIGS. 3 and 4 are a schematic perspective view and a schematic cross-sectional view illustrating a light emitting element in accordance with an embodiment.
Figure 4:
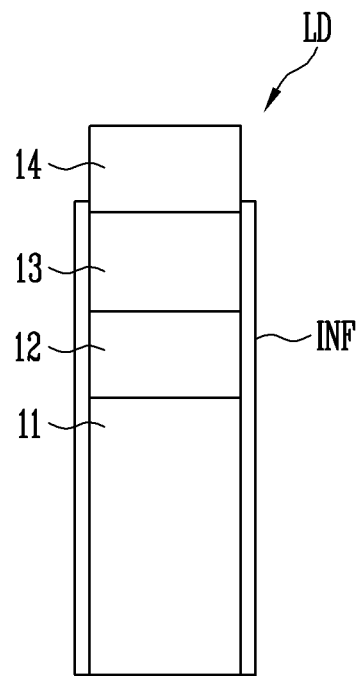
Figure 5:
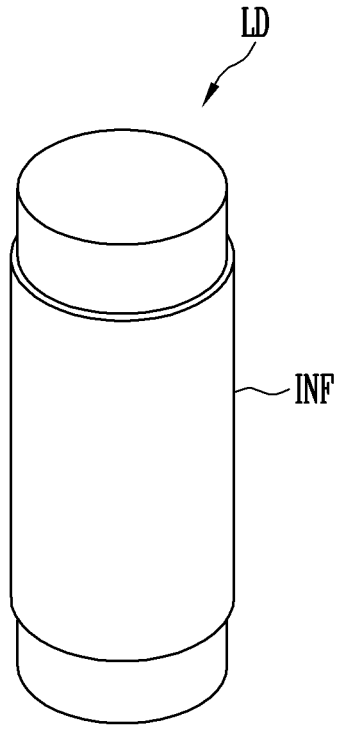
FIGS. 5 and 6 are a schematic perspective view and a schematic cross-sectional view illustrating a light emitting element in accordance with an embodiment.
Figure 6:
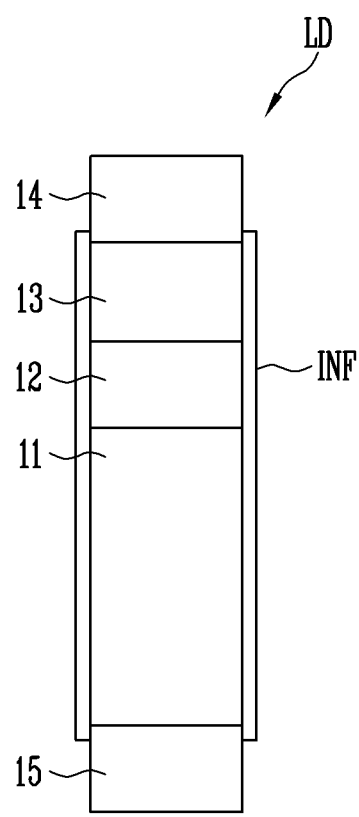

FIGS. 3 and 4 are a schematic perspective view and a schematic cross-sectional view illustrating a light emitting element in accordance with an embodiment. FIGS. 5 and 6 are a schematic perspective view and a schematic cross-sectional view illustrating a light emitting element in accordance with an embodiment.

Referring to FIGS. 3 and 4, the light emitting element LD may further include at least one electrode layer 14 disposed on one end or an end of the second conductive electrode layer 13.

Referring to FIGS. 5 and 6, the light emitting element LD may further include at least one electrode layer 15 disposed on one end or an end of the first conductive electrode layer 11.

Each of the electrode layers 14 and 15 may be an ohmic contact electrode, but the disclosure is not limited thereto. Furthermore, each of the electrode layers 14 and 15 may include metal or conductive metal oxide. For example, each of the electrode layers 14 and 15 may be formed of transparent electrode materials such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO) alone or in combination. The electrode layers 14 and 15 may be substantially transparent or semitransparent. Thereby, light generated from the light emitting element LD may be emitted to the outside after passing through the electrode layers 14 and 15.

In an embodiment, the insulating film INF may at least partially enclose the outer circumferential surfaces of the electrode layers 14 and 15, or may not enclose them. In other words, the insulating film INF may be selectively formed on the surfaces of the electrode layers 14 and 15. Furthermore, the insulating film INF may be formed to expose the opposite ends of the light emitting element LD that have different polarities, for example, may allow at least one area or an area of each of the electrode layers 14 and 15 to be exposed. However, the disclosure is not limited thereto, and the insulating film INF may not be provided.

Since the insulating film INF is provided on the surface of the light emitting element LD, for example, on the surface of the active layer 12, the active layer 12 may be prevented from short-circuiting with at least one electrode (for example, at least one contact electrode of contact electrodes connected to the opposite ends of the light emitting element LD), for example. Consequently, the electrical stability of the light emitting element LD may be secured.

Furthermore, since the insulating film INF is formed on the surface of the light emitting element LD, surface defects of the light emitting element LD may be minimized, and the lifespan and efficiency of the light emitting element LD may be improved. Moreover, since the insulating film INF may be formed on the light emitting element LD, an undesired short circuit between the light emitting elements LD may be prevented from occurring even if light emitting elements LD are arranged (or disposed) in close proximity to each other.

In an embodiment, the light emitting element LD may be manufactured through a surface treatment process (for example, coating). For example, in case that light emitting elements LD are mixed with fluidic solution (or solvent) and supplied to each emission area (for example, an emission area of each pixel), the light emitting elements LD may be uniformly dispersed in the solution without being non-uniformly aggregated. Here, the emission area may be an area in which light is emitted by the light emitting elements LD, and thus be distinguished from a non-emission area in which light is not emitted.

In an embodiment, the insulating film INF itself may be formed of a hydrophobic film using hydrophobic material, or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). The hydrophobic material may include octadecyl trichlorosilane, fluoroalkyl trichlorosilane, perfluoroalkyl triethoxysilane, for example. Furthermore, the hydrophobic material may be a commercialized fluorine-containing material such as Teflon™ or Cytop™, or a material corresponding thereto.

A light emitting device including the light emitting element LD may be used in various types of devices including a display device which requires a light source. For instance, at least one subminiature light emitting element LD, for example, subminiature light emitting elements LD each having a size ranging from the nanoscale to the microscale, may be disposed in each pixel area of the display panel to form a light source (or, a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device, which requires a light source.

Figure 7:
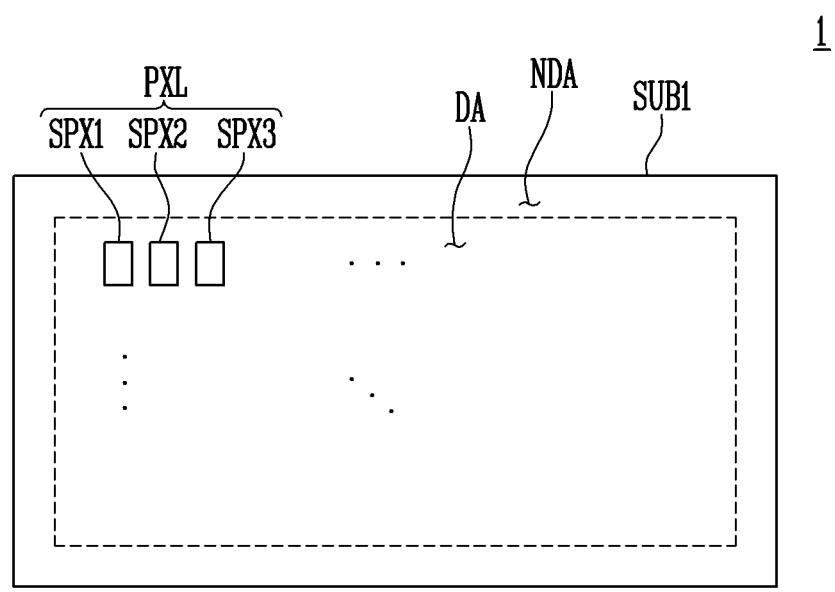
FIG. 7 is a schematic plan view illustrating a display device in accordance with an embodiment.
Figure 7:
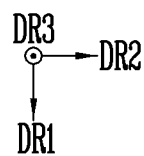

FIG. 7 is a schematic plan view illustrating a display device in accordance with an embodiment. In an embodiment, FIG. 7 illustrates a display device 1 that may use the light emitting elements LD described with reference to FIGS. 1 to 6 as a light source. In accordance with the embodiment, FIG. 7 simply illustrates a structure of the display device 1, centered on a display area DA. In an embodiment, although not illustrated, at least one driving circuit component (for example, at least one of a scan driver and a data driver) and/or lines may be further disposed in the display device 1.

Referring to FIG. 7, the display device 1 may have the shape of a rectangle that is longer in a second direction DR2 than in a first direction DR1. A thickness direction of the display device 1 is indicated by a third direction DR3. However, since the directions indicated by the first to third directions DR1, DR2 and DR3 are relative concepts, each direction may be converted into another direction. Hereinafter, the first to third directions DR1, DR2, and DR3 refer to the same reference numerals in the directions indicated by the first to third directions DR1, DR2, and DR3, respectively. The display device 1 may have various shapes without being limited to the shape shown in the drawings.

The display device 1 may include a base layer SUB1 (or substrate), and a pixel PXL disposed on the base layer SUB1. In detail, the display device 1 and the base layer SUB1 may include a display area DA that displays an image, and a non-display area NDA other than the display area DA.

In an embodiment, the display area DA may be disposed in a central portion of the display device 1, and the non-display area NDA may be disposed along a perimeter of the display device 1 to enclose the display area DA. The locations of the display area DA and the non-display area NDA are not limited thereto, and the locations thereof may be changed.

The base layer SUB1 may form a base of the display device 1. For example, the base layer SUB1 may form a base of a lower panel (for example, a lower plate of the display device 1).

In an embodiment, the base layer SUB1 may be a rigid substrate or a flexible substrate, and the material or properties thereof are not particularly limited. For example, the base layer SUB1 may be a rigid substrate made of glass or reinforced glass, or a flexible substrate formed of a thin film made of plastic or metal. Furthermore, the base layer SUB1 may be a transparent substrate, but the disclosure is not limited thereto. For instance, the base layer SUB1 may be a translucent substrate, an opaque substrate, or a reflective substrate.

One area or an area on the base layer SUB1 may be defined as the display area DA in which the pixels PXL are disposed, and the other area thereof may be defined as the non-display area NDA. For example, the base layer SUB1 may include the display area DA including emission areas on which the pixels PXL are formed, and the non-display area NDA disposed around the display area DA. Various lines and/or internal circuits which are connected to the pixels PXL of the display area DA may be disposed in the non-display area NDA.

Each pixel PXL may include at least one light emitting element LD, which is driven by a corresponding scan signal and a corresponding data signal, for example, at least one rod-type light emitting diode according to any one of embodiments shown in FIGS. 1 to 6. For example, the pixel PXL may include rod-type light emitting diodes, each of which has a small size ranging from the nanoscale to the microscale, and which are connected in series and/or parallel to each other. The rod-type light emitting diodes may form a light source of the pixel PXL.

Furthermore, the pixel PXL may include sub-pixels. For example, the pixel PXL may include a first sub-pixel SPX1, a second sub-pixel SPX2, and a third sub-pixel SPX3. In an embodiment, the first, second, and third sub-pixels SPX1, SPX2, and SPX3 may emit different colors of light. For instance, the first sub-pixel SPX1 may be a red sub-pixel that emits red light, the second sub-pixel SPX2 may be a green sub-pixel the emits green light, and the third sub-pixel SPX3 may be a blue sub-pixel that emits blue light. However, the colors, types and/or number of sub-pixels forming each pixel PXL are not particularly limited. For example, the color of light which is emitted from each sub-pixel may be changed in various ways. Although in FIG. 7 there is illustrated an embodiment where the pixels PXL are arranged (or disposed) in the display area DA in a stripe shape, the disclosure is not limited thereto. For example, the pixels PXL may be arranged (or disposed) in various pixel array forms within the spirit and the scope of the disclosure.

In an embodiment, each of the sub-pixels SPX1, SPX2, and SPX3 may include unit pixels SSPX1, SSPX2, and SSPX3.

Figure 8:
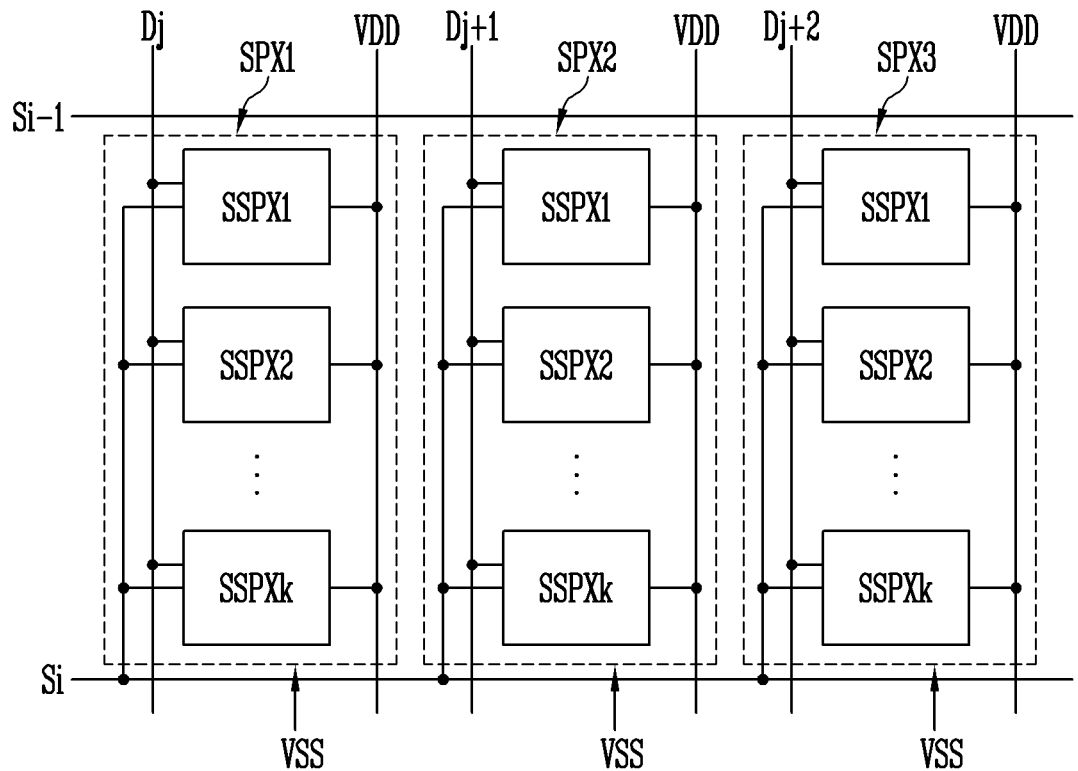
FIG. 8 is a circuit diagram of an equivalent circuit illustrating an example of a sub-pixel included in the display device of FIG. 7.

FIG. 8 is a circuit diagram of an equivalent circuit illustrating an example of a sub-pixel included in the display device of FIG. 7. FIG. 8 illustrates the first to third sub-pixels SPX1, SPX2, and SPX3 included in the display device 1 of FIG. 7.

Since the first to third sub-pixels SPX1, SPX2, and SPX3 are substantially equal to each other except that the first to third sub-pixels SPX1, SPX2, and SPX3 are connected to corresponding data lines Dj, Dj+1, and Dj+2, respectively, the first to third sub-pixels SPX1, SPX2, and SPX3 will be comprehensively described based on the first sub-pixel SPX1.

The first to third sub-pixels SPX1, SPX2, and SPX3 may be disposed in areas, respectively, which are partitioned by scan lines Si−1 and Si (here, i is a natural number) and data lines Dj, Dj+1, and Dj+2 (here, j is a natural number). For example, the first sub-pixel SPX1 may be disposed in an area defined by i−1-th and i-th scan lines Si−1 and Si and j-th and j+1-th data lines Dj and Dj+1. However, the arrangement of the first to third sub-pixels SPX1, SPX2, and SPX3 is not limited thereto.

The first sub-pixel SPX1 may be connected to the scan line Si and the data line Dj, and also be connected to a first power line and a second power line. Here, a first power supply VDD may be applied to the first power line, and a second power supply VSS may be applied to the second power line. Each of the first and second power lines may be a common line connected to sub-pixels. The first and second power supplies VDD and VSS may have different potentials to allow the first sub-pixel SPX1 to emit light. The first power supply VDD may have a voltage level higher than that of the second power supply VSS.

In an embodiment, the first sub-pixel SPX1 may include at least one or more unit pixels SSPX1 to SSPXk (here, k is a natural number).

Each of the unit pixels SSPX1 to SSPXk may be connected to the scan line Si and the data line Dj, and also be connected to the first power line and the second power line. Each of the unit pixels SSPX1 to SSPXk may emit light having a luminance corresponding to a data signal transmitted through the data line Dj in response to a scan signal transmitted through the scan line Si. The unit pixels SSPX1 to SSPXk may include substantially a same pixel structure or pixel circuit.

In other words, the first sub-pixel SPX1 may include unit pixels SSPX1 to SSPXk that independently emit light, in response to one scan signal and one data signal.

In an embodiment, each of the unit pixels SSPX1 to SSPXk (or sub-pixels SPX1 to SPX3) may be formed as an active pixel. However, the types, structures, and/or driving schemes of the unit pixels applicable to the display device 1 according to the disclosure are not particularly limited. For example, the unit pixel may be formed as a pixel of the display device 1 having various passive or active structures within the spirit and the scope of the disclosure.

FIGS. 9 to 12 are circuit diagrams of equivalent circuits illustrating an example applicable to a unit pixel included in the sub-pixel of FIG. 8.

Each drawing will be described based on one unit pixel. Since similar description of FIG. 8 may be applied to the first to the k-th unit pixels SSPX1 to SSPXk shown in FIG. 9, the similar description thereof will be omitted. For example, the first to the k-th unit pixels SSPX1 to SSPXk shown in FIG. 8 have substantially a same or similar structure. The first unit pixel SSPX1 shown in FIGS. 9 to 12 is illustrative, and may be equally or similarly applied to any one of the first to the k-th unit pixels SSPX1 to SSPXk of FIG. 8.

Figure 9:
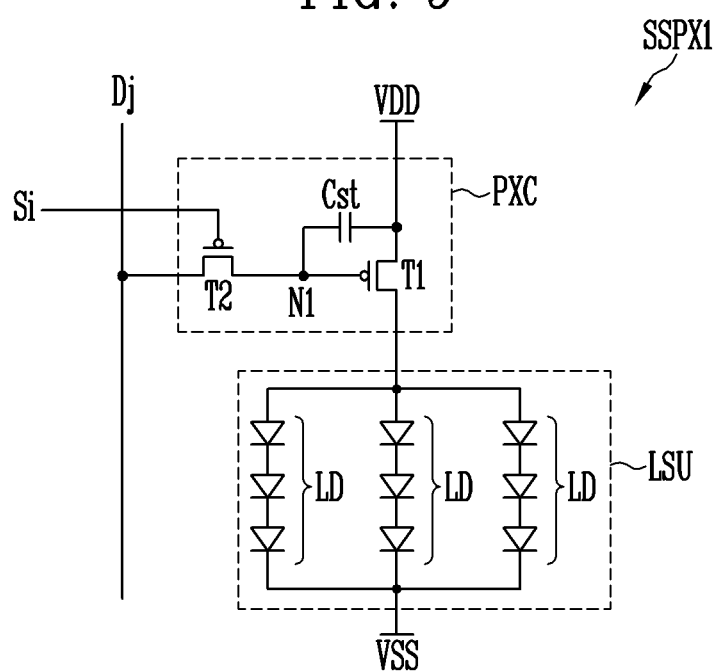
FIGS. 9 to 12 are circuit diagrams of equivalent circuits illustrating an example applicable to a unit pixel included in the sub-pixel of FIG. 8.

First, referring to FIG. 9, the unit pixel SSPX1 may include a light source unit LSU that emits light having a luminance corresponding to a data signal. The unit pixel SSPX1 may selectively further include a pixel circuit PXC that drives the light source unit LSU.

In an embodiment, the light source unit LSU may include light emitting elements LD that are electrically connected between the first power supply VDD and the second power supply VSS. In an embodiment, the light emitting elements LD may be connected to each other in a series/parallel combination structure, but the disclosure is limited thereto. For example, light emitting elements LD may be connected in parallel between the first power supply VDD and the second power supply VSS.

The first and second power supplies VDD and VSS may have different potentials to allow the light emitting elements LD to emit light. For example, the first power supply VDD may be set to a high-potential power supply, and the second power supply VSS may be set as a low-potential power supply. Here, a difference in potential between the first and second power supplies VDD and VSS may be set to a threshold voltage of the light emitting elements LD or more at least during a light emitting period of the unit pixel SSPX1 (or the first sub-pixel SPX1).

Although in FIG. 9 there is illustrated an embodiment in which the light emitting elements LD are connected in parallel to each other in a same direction (for example, in a forward direction) between the first power supply VDD and the second power supply VSS, the disclosure is not limited thereto. For example, some or a number of the light emitting elements LD may be connected to each other in the forward direction between the first and second power supplies VDD and VSS, thus forming respective valid light sources, and the other light emitting elements LD may be connected to each other in the reverse direction. For example, the unit pixel SSPX1 may include only a single light emitting element LD (for example, a single effective light source connected in the forward direction between the first and second power supplies VDD and VSS).

According to an embodiment, one end or an end of each of the light emitting elements LD may be connected in common to a corresponding pixel circuit PXC by a first electrode, and may be connected to the first power supply VDD by the pixel circuit PXC and the first power line. A remaining end of each of the light emitting elements LD may be connected in common to the second power supply VSS by a second electrode and the second power supply line.

The light source unit LSU may emit light having a luminance corresponding to driving current supplied thereto through the corresponding pixel circuit PXC. Hence, an image may be displayed on the display area DA (refer to FIG. 7).

The pixel circuit PXC may be connected to the scan line Si and the data line Dj of the corresponding sub-pixel (for example, the first sub-pixel SPX1). For example, if the first sub-pixel SPX1 is disposed on an i-th row and a j-th column in the display area DA, the pixel circuit PXC of the unit pixel S SPX1 may be connected to the i-th scan line Si and the j-th data line Dj of the display area DA.

The pixel circuit PXC may include first and second transistors T1 and T2, and a storage capacitor Cst.

The first transistor T1 (or a driving transistor) may be connected between the first power supply VDD and the light source unit LSU. A gate electrode of the first transistor T1 may be connected to a first node N1. The first transistor T1 may control driving current to be supplied to the light source unit LSU in response to a voltage of the first node N1.

The second transistor T2 (or a switching transistor) may be connected between the data line Dj and the first node N1. A gate electrode of the second transistor T2 may be connected to the scan line Si.

In response to a scan signal of a gate-on voltage (for example, a low voltage) supplied from the scan line Si, the second transistor T2 may be turned on to electrically connect the first node N1 to the data line Dj.

During each frame period, a data signal of a corresponding frame may be supplied to the data line Dj. The data signal may be transmitted to the first node N1 via the second transistor T2. Hence, a voltage corresponding to the data signal may be charged to the storage capacitor Cst.

A first electrode of the storage capacitor Cst may be connected to the first power supply VDD, and a second electrode thereof may be connected to the first node N1. The storage capacitor Cst may be charged with a voltage corresponding to a data signal supplied to the first node N1 during each frame period, and maintain the charged voltage until a data signal of a subsequent frame is supplied.

Although in FIG. 9 the transistors, for example, the first and second transistors T1 and T2, included in the pixel circuit PXC have been illustrated as being formed of P-type transistors, the disclosure is not limited thereto. For example, at least one of the first and second transistors T1 and T2 may be changed to an N-type transistor.

Figure 10:
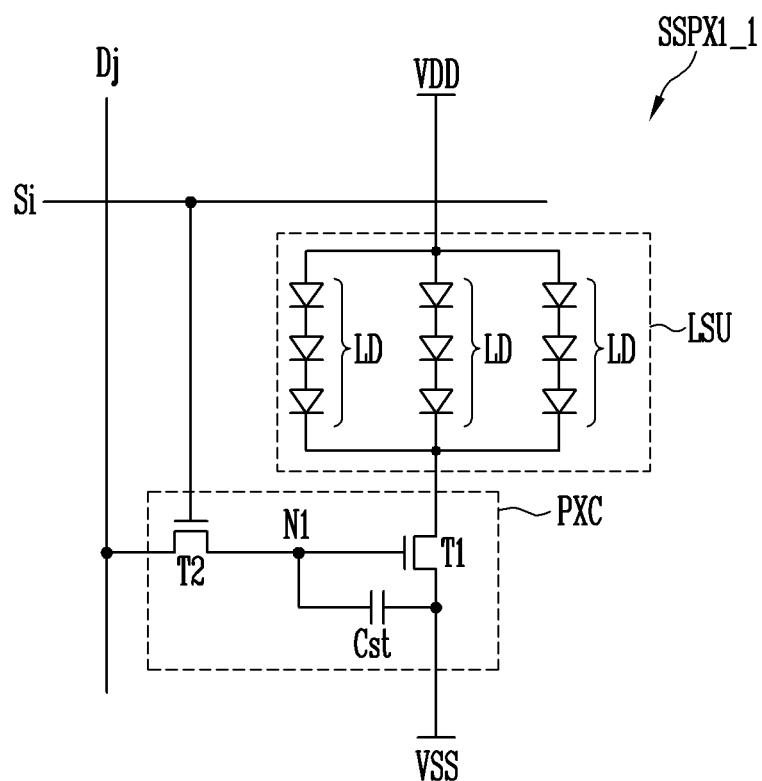

For instance, as shown in FIG. 10, both the first and second transistors T1 and T2 may be formed of N-type transistors. The gate-on voltage of the scan signal for writing the data signal supplied to the data line Dj in each frame period in the unit pixel SSPX1_1 may be a high level voltage. Similarly, the voltage of the data signal for turning on the first transistor T1 may be a voltage having a waveform opposite to that of the embodiment of FIG. 9. By way of example, in the embodiment of FIG. 10, as a gray scale value to be expressed increases, a voltage level of a data signal to be supplied may increase.

The unit pixel SSPX1_1 illustrated in FIG. 10 is substantially similar in configuration and operation to the unit pixel SSPX1 of FIG. 9, except that the connection positions of some or a number of circuit elements and the voltage levels of control signals (for example, a scan signal and a data signal) are changed depending on a change in transistor type. Therefore, detailed description of the unit pixel SSPX1_1 of FIG. 10 will be omitted.

The structure of the pixel circuit PXC is not limited to the embodiments illustrated in FIGS. 9 and 10. In other words, the pixel circuit PXC may be formed of a pixel circuit which may have various structures and/or be operated by various driving schemes within the spirit and the scope of the disclosure. For example, the pixel circuit PXC may be formed in a same manner as that of an embodiment illustrated in FIG. 11.

Figure 11:
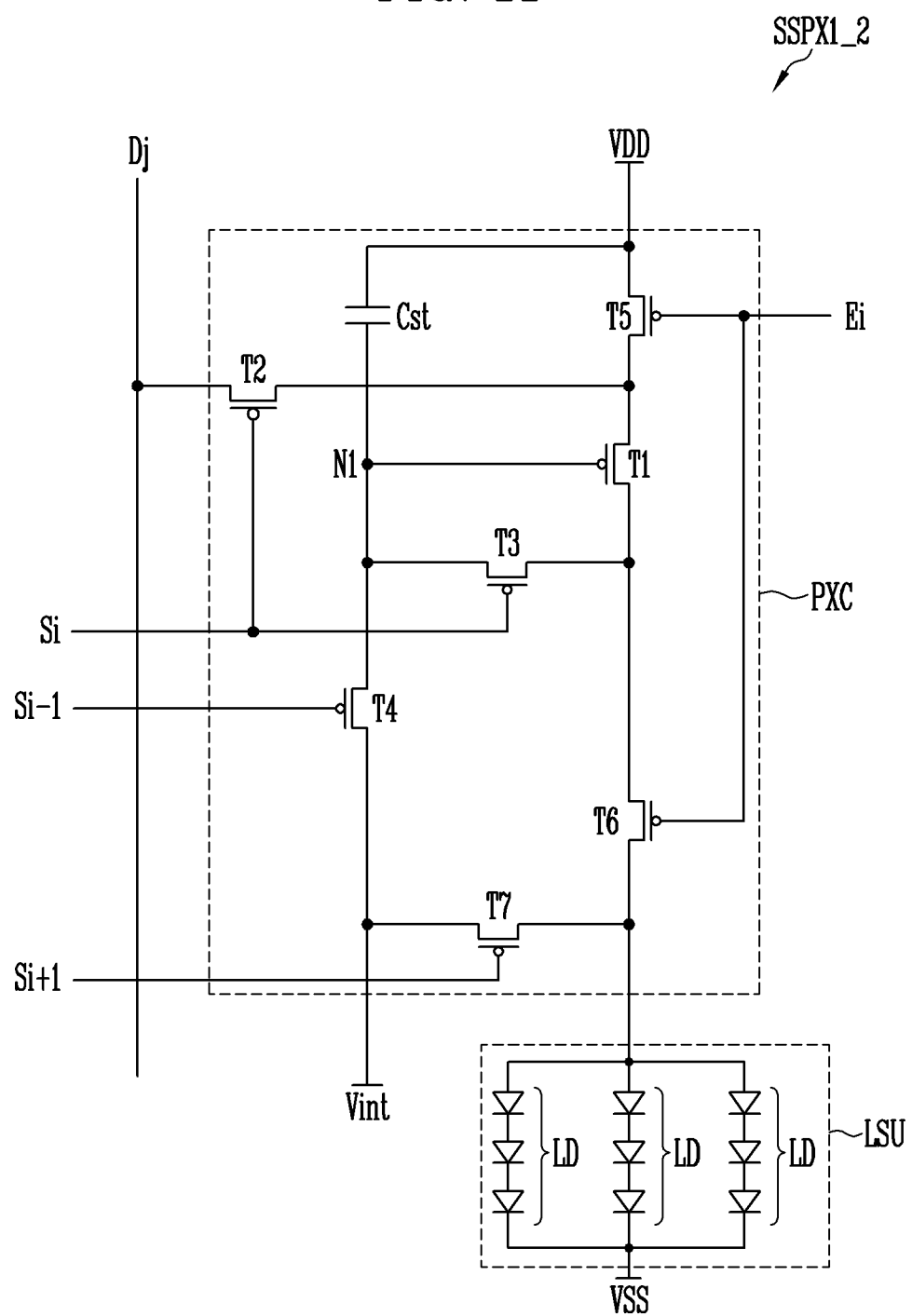

Referring to FIG. 11, the pixel circuit PXC in the unit pixel SSPX1_2 may be coupled or connected not only to a corresponding scan line Si but also to at least one another scan line (or a control line). For example, the pixel circuit PXC of the sub-pixel SPX (or the unit pixel SSPX1_2 included therein) disposed on the i-th row in the display area DA may be further connected to an i−1-th scan line Si−1 and/or an i+1-th scan line Si+1. In an embodiment, the pixel circuit PXC may be connected not only to the first and second power supplies VDD and VSS but also to other power supplies. For example, the pixel circuit PXC may also be connected to an initialization power supply Vint.

In an embodiment, the pixel circuit PXC may include first to seventh transistors T1 to T7 and a storage capacitor Cst.

The first transistor T1 may be connected between the first power supply VDD and the light source unit LSU. A first electrode (for example, a source electrode) of the first transistor T1 may be connected to the first power supply VDD through the fifth transistor T5, and a second electrode (for example, a drain electrode) of the first transistor T1 may be connected via the sixth transistor T6 to one electrode of the light source unit LSU (for example, the first electrode of the corresponding sub-pixel SPX). A gate electrode of the first transistor T1 may be connected to a first node N1. The first transistor T1 may control driving current to be supplied to the light source unit LSU in response to a voltage of the first node N1.

The second transistor T2 may be connected between the data line Dj and the first electrode of the first transistor T1. A gate electrode of the second transistor T2 may be connected to the corresponding scan line Si. In case that a scan signal having a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be connected between the second electrode (for example, the drain electrode) of the first transistor T1 and the first node N1. A gate electrode of the third transistor T3 may be connected to the corresponding scan line Si. In case that a scan signal of a gate-on voltage is supplied from the scan line Si, the third transistor T3 may be turned on to connect the first transistor T1 in the form of a diode.

The fourth transistor T4 may be connected between the first node N1 and the initialization power supply Vint. A gate electrode of the fourth transistor T4 may be connected to a previous scan line, for example, an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 may be connected between the first power supply VDD and the first transistor T1. A gate electrode of the fifth transistor T5 may be connected to a corresponding emission control line, for example, an i-th emission control line Ei. The fifth transistor T5 may be turned off in case that an emission control signal having a gate-off voltage (for example, a high voltage) is supplied to the emission control line Ei, and may be turned on in other cases.

The sixth transistor T6 may be connected between the first transistor T1 and the first electrode of the light source unit LSU. A gate electrode of the sixth transistor T6 may be connected to a corresponding emission control line, for example, the i-th emission control line Ei. The sixth transistor T6 may be turned off in case that an emission control signal of a gate-off voltage is supplied to the emission control line Ei, and may be turned on in other cases.

The seventh transistor T7 may be connected between the first electrode of the light source unit LSU and the initialization power supply Vint (or a third power line to transmit initialization power). A gate electrode of the seventh transistor T7 may be connected to any one of scan lines of a subsequent stage, for example, to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first electrode of the light source unit LSU. During each initialization period in which the voltage of the initialization power supply Vint is transmitted to the light source unit LSU, the voltage of the first electrode of the light source unit LSU may be initialized.

The control signal for controlling the operation of the seventh transistor T7 may be variously changed. For example, the gate electrode of the seventh transistor T7 may be connected to a scan line of a corresponding horizontal line, for example, an i-th scan line Si. In case that a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage corresponding both to the data signal applied to the first node N1 during each frame period and to the threshold voltage of the first transistor T1.

Although in FIG. 11 the transistors, for example, the first to seventh transistors T1 to T7, included in the pixel circuit PXC have been illustrated as being formed of P-type transistors, the disclosure is not limited thereto. For example, at least one of the first to seventh transistors T1 to T7 may be changed to an N-type transistor.

In an embodiment, the pixel circuit PXC may be further connected to another line as well as the data line Dj.

Figure 12:
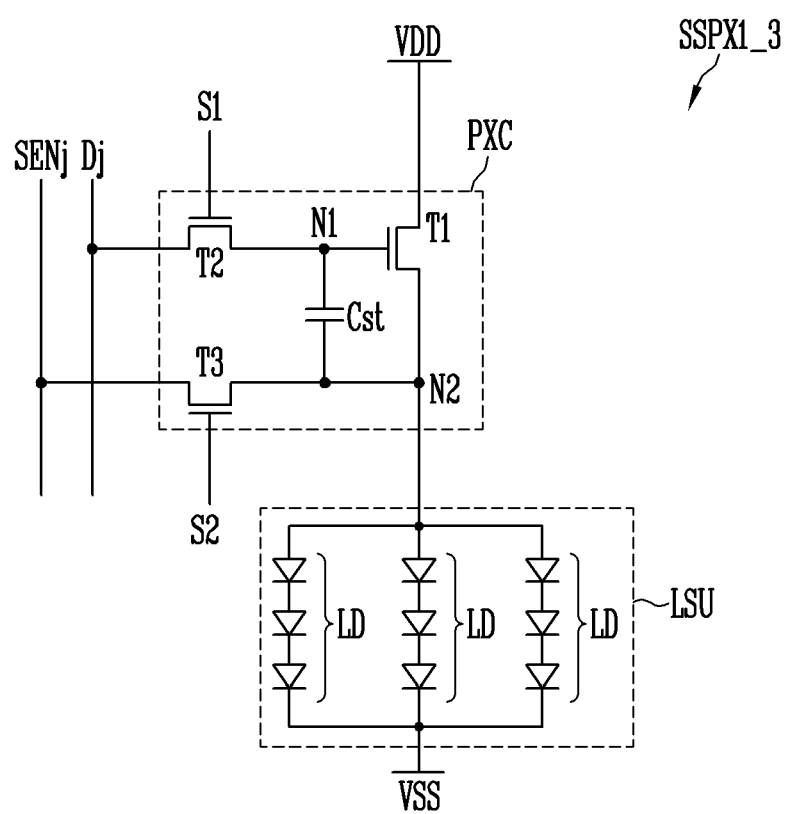

Referring to FIG. 12, the pixel circuit PXC in the unit pixel SSPX1_3 may be coupled or connected to a sensing line SENj. The pixel circuit PXC may include first to third transistors T1 to T3, and a storage capacitor Cst. Since the first and second transistors T1 and T2 and the storage capacitor Cst are substantially equal or similar to the first and second transistors T1 and T2 and the storage capacitor Cst described with reference to FIG. 10, redundant description thereof will be omitted.

The third transistor T3 may be connected between the sensing line SENj and a second node N2. A gate electrode of the third transistor T3 may be connected to a second scan line S2 different from a first scan line S1 (for example, a j+1-th scan line Sj+1 different from a j-th scan line Sj).

The light source unit LSU may be connected between the second node N2 and the second power supply line (for example, the power supply line to which the second power supply VSS is applied).

The third transistor T3 may be turned on in response to a scan signal having a gate-on voltage transmitted from the second scan line S2, and thus electrically connect the sensing line SENj to the second node N2.

For example, in case that the third transistor T3 is turned on while driving current corresponding to a reference voltage flows through the first transistor T1, the driving current flowing through the first transistor T1 may be provided to an external sensing device through the third transistor T3 and the sensing line SENj, and a signal corresponding to the characteristics (for example, Vth) of the first transistor T1 based on the driving current may be output through the sensing line SENj to an external device.

The structure of the unit pixel SSPX1 applicable to the disclosure is not limited to the embodiments illustrated in FIGS. 9 to 12, and the unit pixel SSPX1 may have various structures within the spirit and the scope of the disclosure. For example, the pixel circuit PXC included in the unit pixel SSPX1 may be formed of a pixel circuit which may have various structures and/or be operated by various driving schemes within the spirit and the scope of the disclosure. Furthermore, the unit pixel SSPX1 may be formed in a passive light emitting display device 1 or the like within the spirit and the scope of the disclosure. The pixel circuit PXC may be omitted, and each of the first and second electrodes of the light source unit LSU may be connected to or directly connected to the scan line Si, the data line Dj, the power line, and/or the control line.

Figure 13:
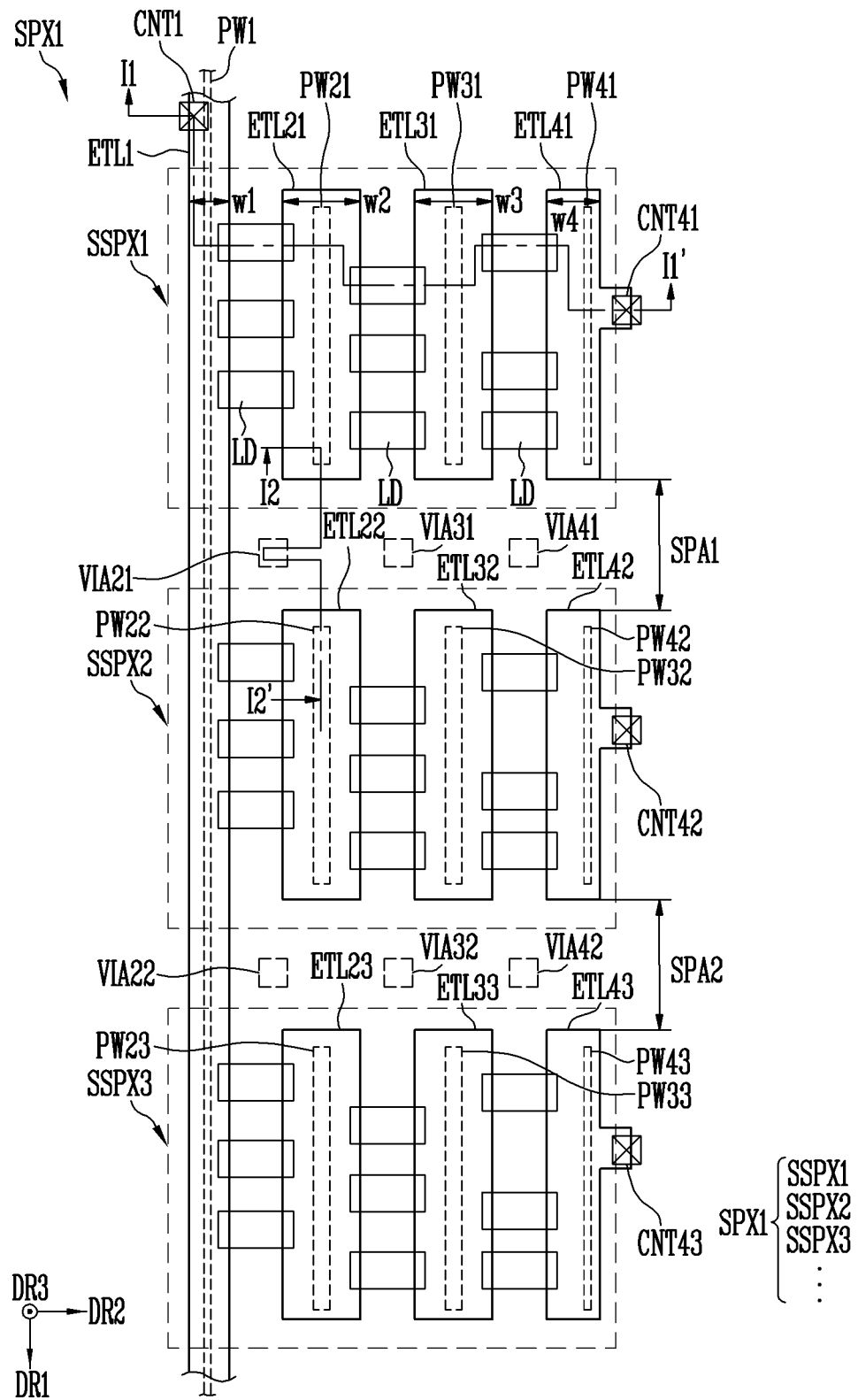
FIG. 13 is a schematic plan view diagram illustrating arrangement of part of a sub-pixel included in the display device of FIG. 7.

FIG. 13 is a schematic plan view diagram illustrating arrangement of part of a sub-pixel included in the display device of FIG. 7. FIG. 13 illustrates the structure of the unit pixels SSPX1 to SSPX3 based on the light source unit LSU (see FIGS. 9 to 12) (or a light emitting element layer) included in the unit pixels SSPX1 to SSPX3. Since the first to third unit pixels SSPX1 to SSPX3 are substantially equal to each other, the light source unit LSU will be described based on the first unit pixel SSPX1.

Referring to FIG. 13, the first unit pixel SSPX1 may include a first electrode ETL1, a second electrode ETL21, a third electrode ETL31, and a fourth electrode ETL41, and at least one light emitting element LD connected between the respective electrodes ETL1, ETL21, ETL31, and ETL41.

In an embodiment, the light emitting elements LD included in a same unit pixel SSPX1 to SSPX3 may emit light of a same color. In an embodiment, the first to third unit pixels SSPX1 to SSPX3 may define emission areas that emit different colors of light. For example, the first unit pixel SSPX1 may include light emitting elements LD that emit red light, the second unit pixel SSPX2 may include light emitting elements LD that emit green light, and the third unit pixel SSPX3 may include light emitting elements LD that emit blue light. In an embodiment, all of the first to third unit pixels SSPX1 to SSPX3 may include light emitting elements LD that emit blue light. In order to form a full-color pixel PXL, a light conversion layer and/or a color filter for converting the color of light emitted from the corresponding unit pixel may be disposed on at least some or a number of the first to third unit pixels SSPX1 to SSPX3.

The first to fourth electrodes ETL1, ETL21, ETL31, and ETL41 in the first unit pixel SSPX1 each may generally extend in the first direction DR1, and may be spaced apart from each other by a distance in the second direction DR2 and disposed in parallel to each other. In an embodiment, an extension length of the first electrode ETL1 with respect to the first direction DR1 may be greater than an extension length of each of the second to fourth electrodes ETL21, ETL31, and ETL41 with respect to the first direction DR1.

In an embodiment, the first electrode ETL1 may be an electrode shared by the first to third unit pixels SSPX1 to SSPX3. The first to third unit pixels may be disposed in the first direction DR1. Here, the first to fourth electrodes ETL1, ETL22, ETL32, and ETL42 in the second unit pixel SSPX2 each may generally extend in the first direction DR1, and may be spaced apart from each other by a distance in the second direction DR2 and disposed in parallel to each other. Likewise, the first to fourth electrodes ETL1, ETL23, ETL33, and ETL43 in the third unit pixel SSPX3 each may generally extend in the first direction DR1, and may be spaced apart from each other by a distance in the second direction DR2 and disposed in parallel to each other.

The second electrode ETL21 of the first unit pixel SSPX1, the second electrode ETL22 of the second unit pixel SSPX2, and the second electrode ETL23 of the third unit pixel SSPX3 may be disposed at positions spaced apart from each other in the first direction DR1. The second electrode ETL21 of the first unit pixel SSPX1 and the second electrode ETL22 of the second unit pixel SSPX2 may be spaced apart from each other by a width of a first separation area SPA1. The second electrode ETL22 of the second unit pixel SSPX2 and the second electrode ETL23 of the third unit pixel SSPX3 may be spaced apart from each other by a width of a second separation area SPA2. The second electrode ETL21 of the first unit pixel SSPX1, the second electrode ETL22 of the second unit pixel SSPX2, and the second electrode ETL23 of the third unit pixel SSPX3 may be formed by dividing one electrode material into parts, whereby the first separation area SPA1 and the second separation area SPA2 that are areas formed between the divided parts may be defined. In an embodiment, the widths of the first separation area SPA1 and the second separation area SPA2 may be the same as each other. Explanation of the second electrodes ETL21, ETL22, and ETL23 described above may also be applied to the third electrodes ETL31, ETL32, and ETL33 and the fourth electrodes ETL41, ETL42, and ETL43. Furthermore, the first separation area SPA1 and the second separation area SPA2 may be defined in a same manner by the third electrode ETL31 of the first unit pixel SSPX1, the third electrode ETL32 of the second unit pixel SSPX2, and the third electrode ETL33 of the third unit pixel SSPX3, and may also be defined in a same manner by the fourth electrode ETL41 of the first unit pixel SSPX1, the fourth electrode ETL42 of the second unit pixel SSPX2, and the fourth electrode ETL43 of the third unit pixel SSPX3.

In an embodiment, widths w1 and w4 of the first electrode ETL1 and the fourth electrode ETL41 may be less than widths w2 and w3 of the second electrode ETL21 and the third electrode ETL31.

In an embodiment, the first electrode ETL1 may be a cathode electrode that is electrically connected to the second power supply VSS. The fourth electrode ETL41 may be an anode electrode that is electrically connected to the first power supply VDD. The second electrode ETL21 and the third electrode ETL31 may be island electrodes that float from the first electrode ETL1 and the fourth electrode ETL41. The light emitting elements LD are disposed such that first ends and second ends thereof are electrically connected between the first electrode ETL1 and the second electrode ETL21, between the second electrode ETL21 and the third electrode ETL31, and between the third electrode ETL31 and the fourth electrode ETL41, whereby the first electrode ETL1, the second electrode ETL21, the third electrode ETL31, and the fourth electrode ETL41 may be electrically connected. Hereinafter, as needed, the second electrode ETL21 and the third electrode ETL31 may be respectively referred to as a first island electrode and a second island electrode.

A first partition wall (or first bank) PW1, a second partition wall (or second bank) PW21, a third partition wall (or third bank) PW31, and a fourth partition wall (or fourth bank) PW41 may be respectively disposed under or below the first electrode ETL1, the second electrode ETL21, the third electrode ETL31, and the fourth electrode ETL41. In an embodiment, the first electrode ETL1, the second electrode ETL21, the third electrode ETL31, and the fourth electrode ETL41 may be formed to cover the first partition wall PW1, the second partition wall PW21, the third partition wall PW31, and the fourth partition wall PW41 that are respectively disposed thereunder. It is to be understood that more than four partition walls may be included in the description within the spirit and the scope of the disclosure. For example, FIG. 13 and FIG. 28 include partition walls, PW23, PW32, PW33, PW42 and PW43. FIG. 29 further includes partition walls, PW11, PW12, PW13, PW14, PW15 and PW16.

The first electrode ETL1 may be electrically connected, through a first contact hole CNT1, to a conductive pattern (for example, a first conductive pattern CE1 of FIG. 14) that is disposed thereunder and electrically connected to the second power supply VSS. Likewise, the fourth electrode ETL41 may be electrically connected, through a second contact hole CNT41, to a conductive pattern (for example, a fifth conductive pattern CE5 of FIG. 14) that is disposed thereunder and electrically connected to the first power supply VDD.

Opening holes VIA21, VIA22, VIA31, VIA32, VIA41, and VIA42 may be provided between the respective second electrodes ETL21, ETL22, and ETL23, the respective third electrodes ETL31, ETL32, and ETL33, and the respective fourth electrodes ETL41, ETL42, and ETL43 that are disposed in adjacent unit pixels. The opening holes VIA21, VIA22, VIA31, VIA32, VIA41, and VIA42 may be adjacent to the respective corresponding second electrodes ETL21, ETL22, and ETL23, the respective corresponding third electrodes ETL31, ETL32, and ETL33, and the respective corresponding fourth electrodes ETL41, ETL42, and ETL43. The opening holes VIA21, VIA22, VIA31, VIA32, VIA41, and VIA42 may be positioned in the first separation area SPA1 or the second separation area SPA2. The opening holes VIA21, VIA22, VIA31, VIA32, VIA41, and VIA42 may expose the conductive patterns (for example, the first conductive pattern CE1 and the fifth conductive pattern CE5 of FIG. 14). Detailed description of the opening holes VIA21, VIA22, VIA31, VIA32, VIA41, and VIA42 will be made with reference to FIGS. 14 to 21.

Figure 14:
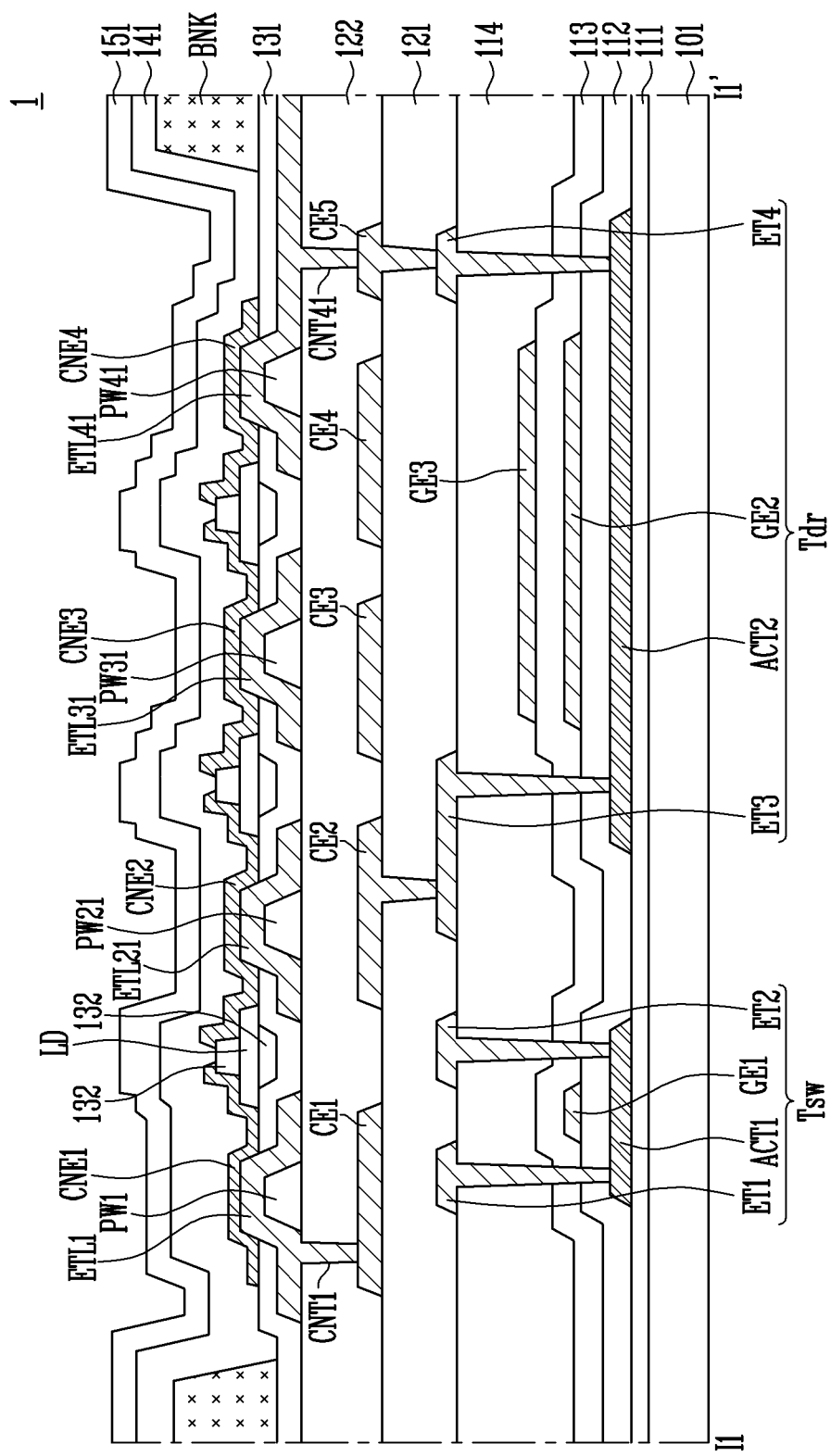
FIG. 14 is a schematic cross-sectional view of the display device taken along line I1-I1' of FIG. 13.
Figure 15:
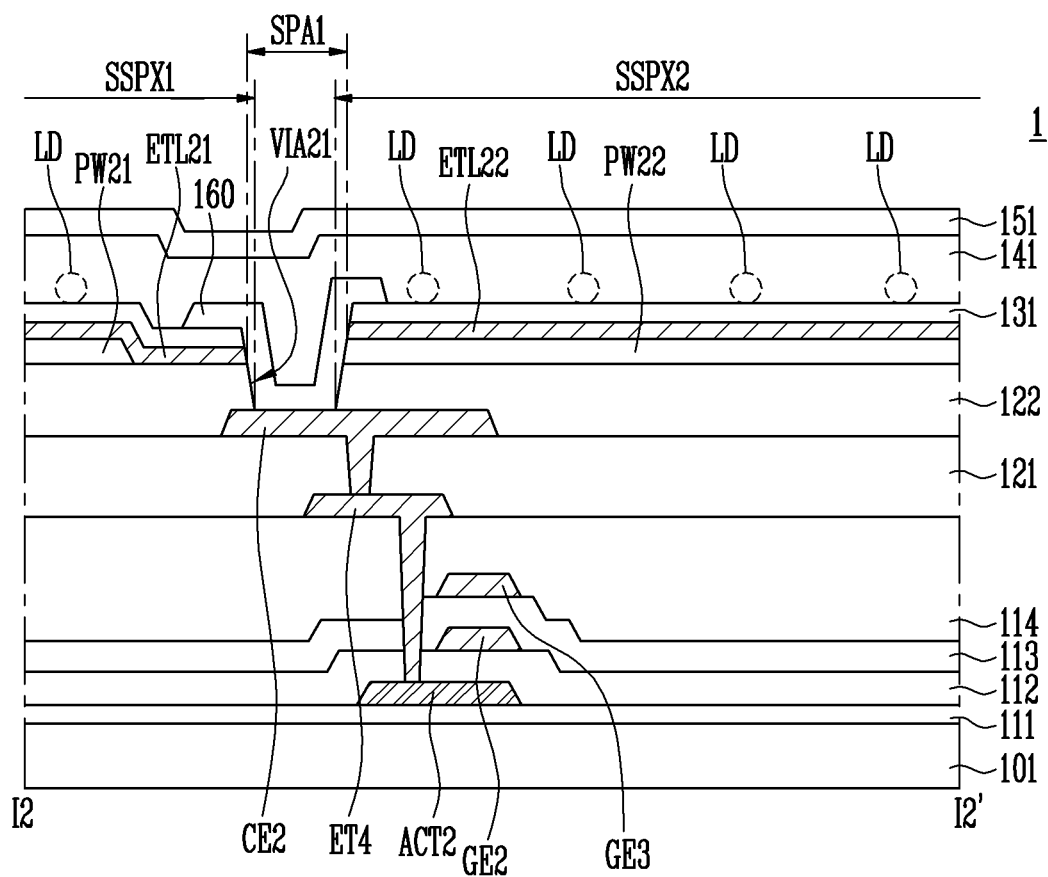
FIG. 15 is a schematic cross-sectional view of the display device taken along line I2-I2' of FIG. 13.
Figure 16:
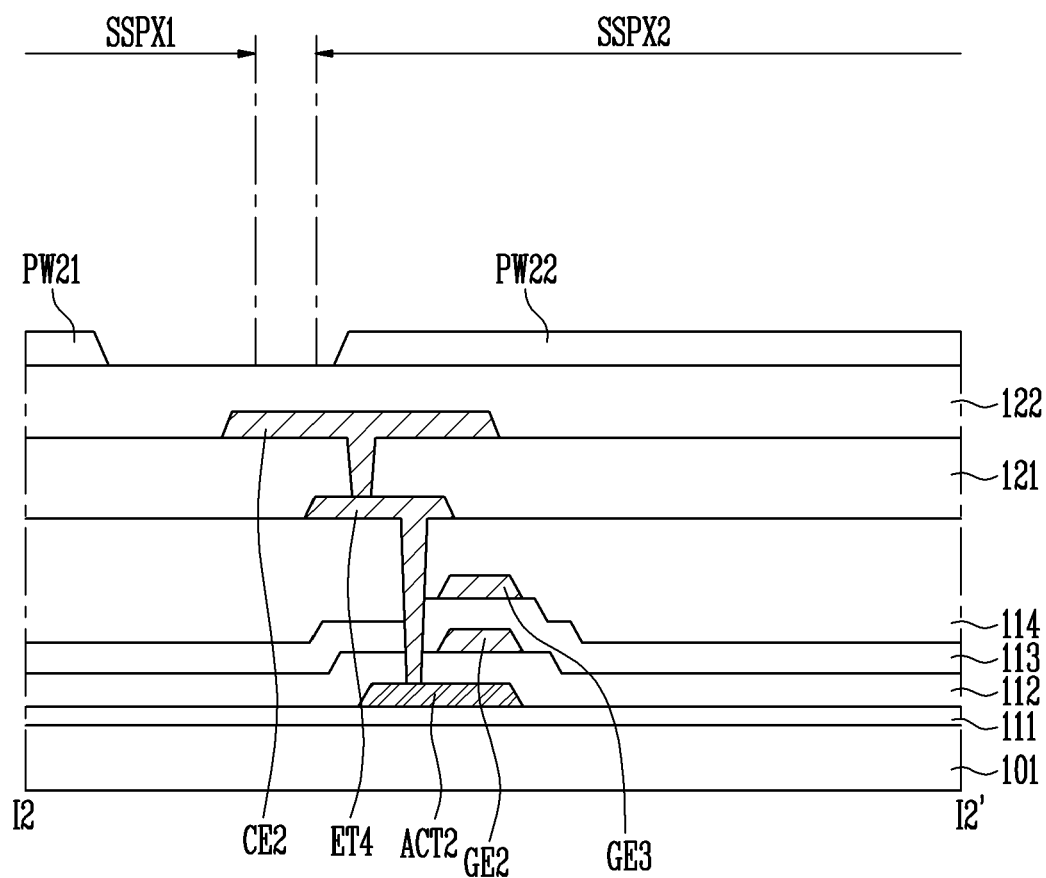
FIGS. 16 to 21 are schematic cross-sectional views illustrating some of the steps of manufacturing the display device based on line I2-I2' of FIG. 13.

FIG. 14 is a schematic cross-sectional view of the display device taken along line I1-I1' of FIG. 13. FIG. 15 is a schematic cross-sectional view of the display device taken along line I2-I2' of FIG. 13. FIGS. 16 to 21 are schematic cross-sectional views illustrating some or a number of the steps of manufacturing the display device, for example, 1a, 1b, 1c, 1d, 1e and 1f based on line I2-I2' of FIG. 13.

Referring to FIGS. 14 and 15, the display device 1 may include a base substrate 101 disposed at a lower portion. Here, the base substrate 101 may correspond to the base layer SUB1 described above. Redundant explanation of the base substrate 101 will be omitted.

A first buffer layer 111 is disposed on the base substrate 101. The first buffer layer 111 functions to make the surface of the base substrate 101 even and to prevent permeation of water or external air. The first buffer layer 111 may be an inorganic layer. The first buffer layer 111 may have a single layer or multilayer structure.

Switching elements Tdr and Tsw are disposed on the first buffer layer 111. Here, each of the switching elements Tdr and Tsw may be a thin film transistor. Two transistors Tdr and Tsw shown in the drawing may be respectively a driving transistor and a switch transistor.

Each of the switching elements Tdr and Tsw may include a semiconductor pattern ACT1, ACT2, a gate electrode GE1, GE2, a source electrode ET1, ET3, and a drain electrode ET2, ET4. For example, the first switching element Tsw that is a switch transistor may include a first semiconductor pattern ACT1, a first gate electrode GE1, a first source electrode ET1, and a first drain electrode ET2. The second switching element Tdr that is a driving transistor may include a second semiconductor pattern ACT2, a second gate electrode GE2, a second source electrode ET3, and a second drain electrode ET4.

By way of example, a semiconductor layer is disposed on the first buffer layer 111. The semiconductor layer may include the first semiconductor pattern ACT1 and the second semiconductor pattern ACT2.

The semiconductor layer may include amorphous silicon, poly silicon, low temperature poly silicon, and an organic semiconductor. In another embodiment, the semiconductor layer may be an oxide semiconductor. Although not clearly illustrated, the semiconductor layer may include a channel area, and a source area and a drain area which are disposed on both sides of the channel area and doped with impurities.

A first gate insulating layer 112 is disposed on the semiconductor layer. The first gate insulating layer 112 may be an inorganic layer. The first gate insulating layer 112 may have a single layer or multilayer structure.

A first conductive layer is disposed on the first gate insulating layer 112. The first conductive layer may include the first gate electrode GE1 and the second gate electrode GE2 that are described above. The first conductive layer may be formed of metal material having conductivity. For example, the first conductive layer may include molybdenum (Mo), aluminum (Al), copper (Cu), and titanium (Ti). The first conductive layer may have a single layer or multilayer structure.

A second gate insulating layer 113 is disposed on the first conductive layer. The second gate insulating layer 113 may be an inorganic layer. The second gate insulating layer 113 may be a single layer or multilayer structure.

A second conductive layer is disposed on the second gate insulating layer 113. The second conductive layer may include a third gate electrode GE3. The third gate electrode GE3 may include a gate electrode of another switching element, which is not illustrated. The second conductive layer may be formed of metal material having conductivity. For example, the second conductive layer may include molybdenum (Mo), aluminum (Al), copper (Cu), and titanium (Ti). The second conductive layer may have a single layer or multilayer structure.

An interlayer insulating layer 114 is disposed on the second conductive layer. The interlayer insulating layer 114 may be an inorganic layer. The interlayer insulating layer 114 may have a single layer or multilayer structure.

A third conductive layer is disposed on the interlayer insulating layer 114. The third conductive layer may include source electrodes ET1 and ET3 and drain electrodes ET2 and ET4. The third conductive layer may be formed of metal material having conductivity. For examples, the source electrodes ET1 and ET3 and the drain electrodes ET2 and ET4 may include aluminum (Al), copper (Cu), titanium (Ti), and molybdenum (Mo).

The source electrodes ET1 and ET3 and the drain electrodes ET2 and ET4 may be electrically connected to the source area and the drain area of each of the semiconductor patterns ACT1 and ACT2 through contact holes passing through the interlayer insulating layer 114, the second gate insulating layer 113, and the first gate insulating layer 112.

Although not illustrated, the display device 1 may further include a storage capacitor disposed on the base substrate 101.

A first protective layer 121 is disposed on the third conductive layer. Here, the first protective layer 121 is disposed to cover a circuit component including the switching elements Tdr and Tsw. The first protective layer 121 may be a passivation layer or a planarization layer. The passivation layer may include $SiO_2$, $SiN_x$, and the like, and the planarization layer may include a material such as acryl and polyimide. The first protective layer 121 may include both the passivation layer or the planarization layer. The passivation layer may be disposed on the third conductive layer and the interlayer insulating layer 114, and the planarization layer may be disposed on the passivation layer. An upper surface of the first protective layer 121 may be planarized.

A fourth conductive layer may be disposed on the first protective layer 121. The fourth conductive layer may include several conductive patterns such as a power supply line, a signal line, and a connection electrode. In a view, the fourth conductive layer is illustrated as including the first to fifth conductive patterns CE1 to CE5. The fourth conductive layer may be formed of metal material having conductivity. For example, the fourth conductive layer may include aluminum (Al), copper (Cu), titanium (Ti), and molybdenum (Mo).

The second conductive pattern CE2 may be connected to any one of the source electrode ET3 and the drain electrode ET4 of the second switching element Tdr through one contact hole passing through the first protective layer 121. The fifth conductive pattern CE5 may be connected to the other one of the source electrode ET3 and the drain electrode ET4 of the second switching element Tdr through another contact hole passing through the first protective layer 121.

A second protective layer 122 is disposed on the fourth conductive layer. The second protective layer 122 may be a passivation layer or a planarization layer. The passivation layer may include $SiO_2$, $SiN_x$, or the like, and the planarization layer may include a material such as acryl and polyimide. The second protective layer 122 may include both the passivation layer or the planarization layer.

The second protective layer 122 may include an opening formed to expose upper portions of some or a number of conductive patterns included in the fourth conductive layer. For example, the second protective layer 122 may include a first opening hole VIA21 formed to expose at least a portion of the second conductive pattern CE2. Although not clearly illustrated, the second protective layer 122 may include a second opening hole VIA31 and a third opening hole VIA41 which respectively expose at least portions of the third conductive pattern CE3 and the fourth conductive pattern CE4.

A portion ranging from the base substrate 101 to the second protective layer 122 may be referred to as a pixel circuit layer.

The first to fourth partition walls PW1, PW21, PW31, and PW41, the first to fourth electrodes ETL1, ETL21, ETL31, and ETL41, a first insulating layer 131, the light emitting elements LD, a second insulating layer 132, first to fourth contact electrodes CNE1 to CNE4, a third insulating layer 141, and a thin-film encapsulation layer 151 may be successively provided on the second protective layer 122.

The first to fourth partition walls PW1, PW21, PW31, and PW41 may be disposed on the pixel circuit layer (for example, the second protective layer 122). The first to fourth partition walls PW1, PW21, PW31, and PW41 may protrude from the pixel circuit layer in a thickness direction (for example, a third direction DR3). In an embodiment, the first to fourth partition walls PW1, PW21, PW31, and PW41 may have substantially a same height, but the disclosure is not limited thereto. For example, a height to which the first to fourth partition walls PW1, PW21, PW31, and PW41 protrude may range from approximately 1.0 μm to approximately 1.5 μm.

In an embodiment, the first partition wall PW1 may be disposed between the pixel circuit layer and the first electrode ETL1. The second partition wall PW21 may be disposed between the pixel circuit layer and the second electrode ETL21. The third partition wall PW31 may be disposed between the pixel circuit layer and the third electrode ETL31. The fourth partition wall PW41 may be disposed between the pixel circuit layer and the fourth electrode ETL41.

In an embodiment, the first to fourth partition walls PW1, PW21, PW31, and PW41 may have various shapes. By way of example, as illustrated in the drawing, each of the first to fourth partition walls PW1, PW21, PW31, and PW41 may have a cross-sectional shape of a trapezoid that is reduced in width from a bottom to a top thereof. Each of the first to fourth partition walls PW1, PW21, PW31, and PW41 may have an inclined surface on at least one side or a side.

Although not illustrated in the drawing, as another example, each of the first to fourth partition walls PW1, PW21, PW31, and PW41 may have a cross-section of a semicircle or a semiellipse that is reduced in width from a bottom to a top thereof. Each of the first to fourth partition walls PW1, PW21, PW31, and PW41 may have a curved surface on at least one side or a side. In other words, in the disclosure, the shape of each of the first to fourth partition walls PW1, PW21, PW31, and PW41 may be changed in various ways rather than being particularly limited. In an embodiment, at least one of the first to fourth partition walls PW1, PW21, PW31, and PW41 may be omitted or changed in position.

The first to fourth partition walls PW1, PW21, PW31, and PW41 may include insulating material having inorganic material and/or organic material. For example, the first to fourth partition walls PW1, PW21, PW31, and PW41 may include at least one inorganic layer including various inorganic insulating materials, such as $SiN_x$ or $SiO_x$ within the spirit and the scope of the disclosure. For example, the first to fourth partition walls PW1, PW21, PW31, and PW41 each may include at least one organic layer and/or photoresist layer containing various organic insulating materials, or may be formed of a single layer or multilayer insulator containing organic or inorganic materials in combination within the spirit and the scope of the disclosure. In other words, the constituent materials of the first to fourth partition walls PW1, PW21, PW31, and PW41 may be changed in various ways.

In an embodiment, the first to fourth partition walls PW1, PW21, PW31, and PW41 each may function as a reflective component. For example, the first to fourth partition walls PW1, PW21, PW31, and PW41, along with the first to fourth electrodes ETL1, ETL21, ETL31, and ETL41 provided thereon, may function as reflective components that guide light emitted from each light emitting element LD in a desired direction, thus enhancing the light efficiency of the pixel PXL.

The first to fourth electrodes ETL1, ETL21, ETL31, and ETL41 may be respectively disposed over the first to fourth partition walls PW1, PW21, PW31, and PW41. The first to fourth electrodes ETL1, ETL21, ETL31, and ETL41 may be disposed at positions spaced apart from each other.

In an embodiment, the first to fourth electrodes ETL1, ETL21, ETL31, and ETL41 respectively disposed over the first to fourth partition walls PW1, PW21, PW31, and PW41 may have shapes corresponding to the respective shapes of the first to fourth partition walls PW1, PW21, PW31, and PW41. For example, the first to fourth electrodes ETL1, ETL21, ETL31, and ETL41 may respectively have inclined surfaces or curved surfaces corresponding to the first to fourth partition walls PW1, PW21, PW31, and PW41, and protrude in the thickness direction of the display device 1.

Each of the first to fourth electrodes ETL1, ETL21, ETL31, and ETL41 may include at least one conductive material. For example, each of the first to fourth electrodes ETL1, ETL21, ETL31, and ETL41 may include at least one of metal such as Ag, Mg, Al, Pt, Pd, Au, Ni, Nd, Ir, Cr, Ti or an alloy thereof, conductive oxide such as ITO, IZO, ZnO, or ITZO, and a conductive polymer such as PEDOT, but the disclosure is not limited thereto.

Furthermore, each of the first to fourth electrodes ETL1, ETL21, ETL31, and ETL41 may have a single layer or multilayer structure. For example, each of the first to fourth electrodes ETL1, ETL21, ETL31, and ETL41 may include at least one reflective electrode layer. Each of the first to fourth electrodes ETL1, ETL21, ETL31, and ETL41 may selectively further include at least one of at least one transparent electrode layer disposed on an upper portion and/or a lower portion of the reflective electrode layer, and at least one conductive capping layer covering an upper portion of the reflective electrode layer and/or the transparent electrode layer.

In an embodiment, the reflective electrode layers of each of the first to fourth electrodes ETL1, ETL21, ETL31, and ETL41 may be formed of electrode material having uniform reflectivity. For example, the reflective electrode layer may include at least one of metals such as Ag, Mg, Al, Pt, Pd, Au, Ni, Nd, Ir, Cr, and an alloy thereof, but the disclosure is not limited thereto. In other words, reflective electrode layer may be formed of various reflective electrode materials. In case that each of the first to fourth electrodes ETL1, ETL21, ETL31, and ETL41 may include the reflective electrode layer, light emitted from the opposite ends, for example, the first and second ends, of each of the light emitting elements LD may more reliably travel in a direction (for example, the third direction DR3, or the frontal direction) in which an image is displayed. For example, if the first to fourth electrodes ETL1, ETL21, ETL31, and ETL41 have inclined surfaces or curved surfaces corresponding to the shape of the first to fourth partition walls PW1, PW21, PW31, and PW41 and are disposed to face the first ends and the second ends of the light emitting elements LD, light emitted from the first ends and the second ends of the light emitting elements LD may be reflected by the first to fourth electrodes ETL1, ETL21, ETL31, and ETL41 and thus more reliably travel in the frontal direction of the display device 1 (for example, in the third direction DR3 that is the upper direction of the base layer SUB1). Consequently, the efficiency of light emitted from the light emitting elements LD may be enhanced.

Furthermore, the transparent electrode layer of each of the first to fourth electrodes ETL1, ETL21, ETL31, and ETL41 may be formed of various transparent electrode materials. For example, the transparent electrode layer may include ITO, IZO or ITZO, but the disclosure is not limited thereto. In an embodiment, each of the first to fourth electrodes ETL1, ETL21, ETL31, and ETL41 may have a triple layer structure having a stacked structure of ITO/Ag/ITO. As such, if the first to fourth electrodes ETL1, ETL21, ETL31, and ETL41 each are formed of a multilayer structure having at least two or more layers, a voltage drop due to signal delay (RC delay) may be minimized. Thus, a desired voltage can be effectively transmitted to the light emitting elements LD.

If each of the first to fourth electrodes ETL1, ETL21, ETL31, and ETL41 may include the conductive capping layer that covers the reflective electrode layer and/or the transparent electrode layer, the reflective electrode layers, etc. of the first to fourth electrodes ETL1, ETL21, ETL31, and ETL41 may be prevented from being damaged due to defects caused during a process of manufacturing the pixel PXL, for example. However, the conductive capping layer may be selectively included in the first to fourth electrodes ETL1, ETL21, ETL31, and ETL41, and may be omitted depending on embodiments. Furthermore, the conductive capping layer may be considered as a component of each of the first to fourth electrodes ETL1, ETL21, ETL31, and ETL41, or considered as a separate component disposed on the first to fourth electrodes ETL1, ETL21, ETL31, and ETL41.

In an embodiment, at least a partial area of the first electrode ETL1 may overlap the first conductive pattern CE1, at least a partial area of the second electrode ETL21 may overlap the second conductive pattern CE2, at least a partial area of the third electrode ETL31 may overlap the third conductive pattern CE3, and the fourth electrode ETL41 may overlap at least a partial area of each of the fourth conductive pattern CE4 and the fifth conductive pattern CE5. Herein, the term "overlap" means that two components overlap each other in the thickness direction of the display device 1 (in the drawing, a direction (for example, the third direction DR3) perpendicular to the surface of the base layer SUB1)), unless otherwise defined. The first electrode ETL1 may be electrically connected to the first conductive pattern CE1 through the first contact hole CNT1. The fourth electrode ETL41 may be electrically connected to the fifth conductive pattern CE5 through the second contact hole CNT41. The second electrode ETL21 may be insulated from the second conductive pattern CE2. The third electrode ETL31 may be insulated from the third conductive pattern CE3. The fourth electrode ETL41 may be insulated from the fourth conductive pattern CE4.

The first insulating layer 131 may be disposed on partial areas of the first to fourth electrodes ETL1, ETL21, ETL31, and ETL41. For example, the first insulating layer 131 may be formed to cover the partial areas of the first to fourth electrodes ETL1, ETL21, ETL31, and ETL41, and may include an opening to expose other partial areas of the first to fourth electrodes ETL1, ETL21, ETL31, and ETL41.

In an embodiment, the first insulating layer 131 may be primarily formed to cover the overall surfaces of the first to fourth electrodes ETL1, ETL21, ETL31, and ETL41. After the light emitting elements LD are supplied to and aligned on the first insulating layer 131, the first insulating layer 131 may be partially opened to allow the first to fourth electrodes ETL1, ETL21, ETL31, and ETL41 to be exposed. For example, the first insulating layer 131 may be patterned in the form of an individual pattern which is sectionally disposed under or below the light emitting elements LD after the supply and alignment of the light emitting elements LD have been completed.

In other words, the first insulating layer 131 may be interposed between the first to fourth electrodes ETL1, ETL21, ETL31, and ETL41 and the light emitting elements LD, and may allow at least one area or an area of each of the first to fourth electrodes ETL1, ETL21, ETL31, and ETL41 to be exposed. After the first to fourth electrodes ETL1, ETL21, ETL31, and ETL41 are formed, the first insulating layer 131 may be formed to cover the first to fourth electrodes ETL1, ETL21, ETL31, and ETL41, so that, during a subsequent process, the first to fourth electrodes ETL1, ETL21, ETL31, and ETL41 may be prevented from being damaged, or precipitation of metal may be prevented from being caused. Furthermore, the first insulating layer 131 may stably support each light emitting element LD. In an embodiment, the first insulating layer 131 may be omitted.

The light emitting elements LD may be supplied to and aligned in an area in which the first insulating layer 131 is disposed. For example, the light emitting elements LD may be supplied by an inkjet scheme or the like, and the light emitting elements LD may be aligned between the first to fourth electrodes ETL1, ETL21, ETL31, and ETL41 by an alignment voltages (or alignment signals) applied to the first to fourth electrodes ETL1, ETL21, ETL31, and ETL41.

A bank BNK may be disposed on the first insulating layer 131. For example, the bank BNK may be formed, to enclose the sub-pixels (SPX1 to SPX3 of FIG. 8), between other sub-pixels, thus forming a pixel defining layer to define the emission area.

In an embodiment, the bank BNK may not be disposed between the unit pixels SSPX1 to SSPXk in a same one of the sub-pixels SPX1 to SPX3, but the disclosure is not limited thereto.

The second insulating layer 132 may be disposed over the light emitting elements LD, for example, over the light emitting elements LD aligned between the first to fourth electrodes ETL1, ETL21, ETL31, and ETL41, and may allow the first ends and the second ends of the light emitting elements LD to be exposed. For example, the second insulating layer 132 may be partially disposed only on one area or an area of each of the light emitting elements LD, without covering the first ends and second ends of the light emitting elements LD. The second insulating layer 132 may be formed in an independent pattern in each emission area, but, the disclosure is not limited thereto. Furthermore, as illustrated in FIG. 14, in case that space is present between the first insulating layer 131 and the light emitting elements LD before the second insulating layer 132 is formed, the space may be filled with the second insulating layer 132. Consequently, the light emitting elements LD may be more stably supported.

The first to fourth contact electrodes CNE1 to CNE4 may be disposed on the first to fourth electrodes ETL1, ETL21, ETL31, and ETL41 and the first ends and the second ends of the light emitting elements LD. In an embodiment, the first to fourth contact electrodes CNE1 to CNE4 may be disposed on a same layer, as illustrated in FIG. 14. Although the first to fourth contact electrodes CNE1 to CNE4 are formed through a same process using a same or similar electrode material, the disclosure is not limited thereto.

The first to fourth contact electrodes CNE1 to CNE4 may electrically connect the first ends and the second ends of the light emitting elements LD, respectively, to the first and second electrodes ETL1 and ETL21, the second and third electrodes ETL21 and ETL31, or the third and fourth electrodes ETL31 and ETL41.

For example, the first contact electrode CNE1 may be disposed on the first electrode ETL1 to make contact with the first electrode ETL1. For example, the first contact electrode CNE1 may be disposed to contact the first electrode ETL1 on one area or an area of the first electrode ETL1 that is not covered or overlapped by the first insulating layer 131. Furthermore, the first contact electrode CNE1 may be disposed on a first end of at least one light emitting element, for example, first ends of light emitting elements LD, adjacent to the first electrode ETL1 so that the first contact electrode CNE1 contacts the first ends. In other words, the first contact electrode CNE1 may be disposed to cover the first ends of the light emitting elements LD and at least one area or an area of the first electrode ETL1 corresponding thereto. Hence, the first ends of the light emitting elements LD may be electrically connected to the first electrode ETL1.

Likewise, the second contact electrode CNE2 may be disposed on the second electrode ETL21 to contact the second electrode ETL21. For example, the second contact electrode CNE2 may be disposed to contact the second electrode ETL21 on one area or an area of the second electrode ETL21 that is not covered or overlapped by the first insulating layer 131. Furthermore, the second contact electrode CNE2 may be disposed on ends of at least two light emitting elements LD adjacent to the second electrode ETL21 to contact the ends. In other words, the second contact electrode CNE2 may be disposed to cover the first ends or the second ends of the light emitting elements LD and at least one area or an area of the second electrode ETL21 corresponding thereto. Thereby, the first ends or the second ends of the light emitting elements LD may be electrically connected to the second electrode ETL21.

Likewise, the third contact electrode CNE3 may be disposed on the third electrode ETL31 to contact the third electrode ETL31. For example, the third contact electrode CNE3 may be disposed to contact the third electrode ETL31 on one area or an area of the third electrode ETL31 that is not covered or overlapped by the first insulating layer 131. Furthermore, the third contact electrode CNE3 may be disposed on ends of at least two light emitting elements adjacent to the third electrode ETL31 to contact the ends. In other words, the third contact electrode CNE3 may be disposed to cover or overlap the first ends or the second ends of the light emitting elements LD and at least one area or an area of the third electrode ETL31 corresponding thereto. Thereby, the first ends or the second ends of the light emitting elements LD may be electrically connected to the third electrode ETL31.

Likewise, the fourth contact electrode CNE4 may be disposed on the fourth electrode ETL41 to contact the fourth electrode ETL41. For example, the fourth contact electrode CNE4 may be disposed to contact the fourth electrode ETL41 on one area or an area of the fourth electrode ETL41 that is not covered or overlapped by the first insulating layer 131. Furthermore, the fourth contact electrode CNE4 may be disposed on the second ends of at least one or more light emitting elements LD adjacent to the fourth electrode ETL41 to contact the second ends. In other words, the fourth contact electrode CNE4 may be disposed to cover the second ends of the light emitting elements LD and at least one area or an area of the fourth electrode ETL41 corresponding thereto. Hence, the second ends of the light emitting elements LD may be electrically connected to the fourth electrode ETL4.

In other words, a first end of one light emitting element may contact the first contact electrode CNE1, and a second end thereof may contact the second contact electrode CNE2. A first end of another light emitting element may contact the second contact electrode CNE2, and a second end thereof may contact the third contact electrode CNE3. A first end of a further light emitting element may contact the third contact electrode CNE3, and a second end thereof may contact the fourth contact electrode CNE4.

In an embodiment, the first to fourth contact electrodes CNE1 to CNE4 may be disposed on different layers.

The third insulating layer 141 may be formed and/or disposed on the first to fourth partition walls PW1, PW21, PW31, and PW41, the first to fourth electrodes ETL1, ETL21, ETL31, and ETL41, the light emitting elements LD, the first to fourth contact electrodes CNE1 to CNE4, and the bank BNK so as to cover the first to fourth partition walls PW1, PW21, PW31, and PW41, the first to fourth electrodes ETL1, ETL21, ETL31, and ETL41, the light emitting elements LD, the first to fourth contact electrodes CNE1 to CNE4, and the bank BNK.

In an embodiment, each of the first to third insulating layers 131, 132, and 141 may have a single layer or multilayer structure, and include at least one inorganic insulating material and/or organic insulating material. For example, each of the first to third insulating layers 131, 132, and 141 may include various kinds of organic or inorganic insulating materials including $SiN_x$, and the constituent material of each of the first to third insulating layers 131, 132, and 141 is not particularly limited. The first to third insulating layers 131, 132, and 141 may include respective different insulating materials, or at least some or a number of the first to third insulating layers 131, 132, and 141 may include a same insulating material.

A thin-film encapsulation layer 151 including at least one inorganic layer and/or organic layer may be provided on the third insulating layer 141. In an embodiment, the thin-film encapsulation layer 151 may be omitted.

The display device 1 may include a fourth insulating layer 160 provided to cover the opening holes VIA21, VIA22, VIA31, VIA32, VIA41, and VIA42 which expose upper portions of some or a number of the conductive patterns (for example, the second conductive pattern CE2, the third conductive pattern CE3, and the fourth conductive pattern CE4) in the fourth conductive layer through the second protective layer 122. In an embodiment, the fourth insulating layer 160 may be formed to cover the opening holes VIA21, VIA22, VIA31, VIA32, VIA41, and VIA42, the fourth conductive layer, and a portion of the first insulating layer 131. In an embodiment, the fourth insulating layer 160 may be formed to have a same material or a similar material through a same process as that of the second insulating layer 132 described above.

Subsequently, some or a number of the steps of manufacturing the display device 1 will be described based on a cross-section of the display device 1 corresponding to line I2-I2' of FIG. 13. Although description will be made based on an area between the respective second electrodes ETL21 and ETL22 in the first unit pixel SSPX1 and the second unit pixel SSPX2, similar description may also be applied to areas between the third electrodes ETL31 and ETL32, the fourth electrodes ETL41 and ETL42, and other adjacent unit pixels SSPX2 and SSPX3, and the similar description will be omitted.

As described above, the second partition wall PW21 of the first unit pixel SSPX1 and the second partition wall PW22 of the second unit pixel SSPX2 may be formed at positions spaced apart from each other on the second protective layer 122 having a substantially planar upper surface. In other words, the partition walls may be formed on the pixel circuit layer. Here, the upper surface of the second protective layer 122 may be exposed between the second partition wall PW21 of the first unit pixel SSPX1 and the second partition wall PW22 of the second unit pixel SSPX2. The upper surface of the second protective layer 122 that is exposed between the second partition wall PW21 of the first unit pixel SSPX1 and the second partition wall PW22 of the second unit pixel SSPX2 may overlap at least a partial area of the second conductive pattern CE2.

Figure 17:
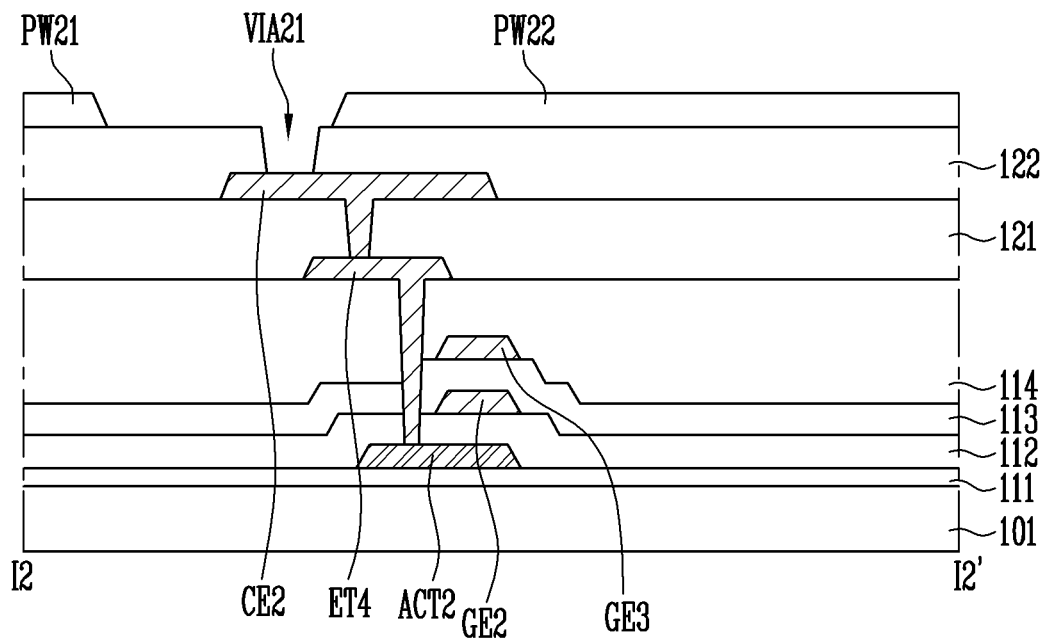

Thereafter, as illustrated in FIG. 17, the opening hole VIA21 may be formed in the second protective layer 122 between the second partition wall PW21 of the first unit pixel SSPX1 and the second partition wall PW22 of the second unit pixel SSPX2 so that at least a portion of the second conductive pattern CE2 may be exposed.

Figure 18:
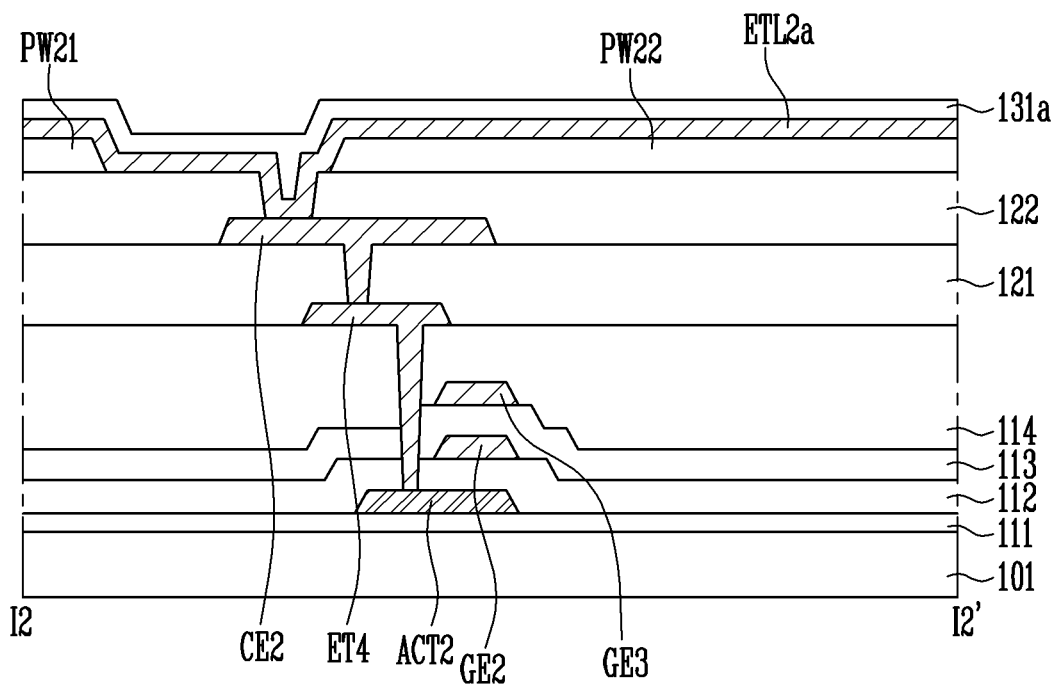

Subsequently, as illustrated in FIG. 18, a second electrode material ETL2a and a first insulating material 131a may be successively formed on the fourth conductive layer, the second protective layer 122, and the second partition wall PW21. Here, the second electrode material ETL2a may be formed of a same material or a similar material as that of the second electrodes ETL21 and ETL22. The first insulating material 131a may be formed of a same material or a similar material as that of the first insulating layer 131. The second electrode material ETL2a may form the above-described second electrodes ETL21, ETL22, and ETL23 during a subsequent process. The first insulating material 131a may form the above-described first insulating layer 131 during a subsequent process.

Here, the second electrode material ETL2a may also be formed in the opening VIA21. Hence, the second electrode material ETL2a may contact the second conductive pattern CE2.

Likewise, although not illustrated, a first electrode material provided to form the first electrode ETL1, a third electrode material provided to form the third electrodes ETL31, ETL32, and ETL33, and a fourth electrode material provided to form the fourth electrodes ETL41, ETL42, and ETL43 may be formed to contact, through the opening holes or the contact holes, the electrode patterns disposed such that at least some or a number of areas thereof overlap the first, second, and third electrode materials. In other words, the first electrode material may contact the first conductive pattern CE1 through the first contact hole CNT1. The third electrode material may contact the third conductive pattern CE3 through one opening hole (for example, VIA31 of FIG. 13). The fourth electrode material may contact the fourth conductive pattern CE4 through one opening hole (for example, VIA41 of FIG. 13). Furthermore, the fourth electrode material may contact the fifth conductive pattern CE5 through the second contact holes CNT41, CNT42, and CNT43.

Figure 19:
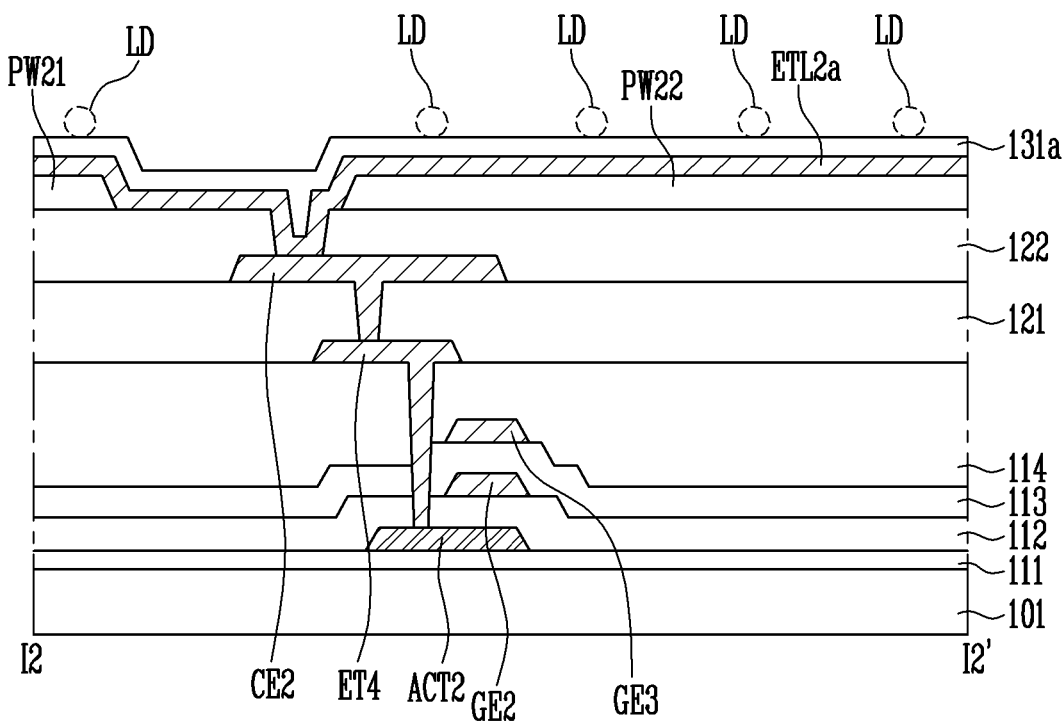

Thereafter, as illustrated in FIG. 19, voltages may be applied to the first electrode material, the second electrode material ETL2a, the third electrode material, and the fourth electrode material so that the light emitting elements LD may be aligned on the first insulating material 131a.

In an embodiment, voltages to be applied to align the light emitting elements LD may be applied in such a way that an AC voltage and a ground voltage alternate each other depending on positions. For example, the AC voltage may be applied to the first electrode material and the third electrode material, and the ground voltage may be applied to the second electrode material ETL2a and the fourth electrode material. In other words, the AC voltage may be applied to the first conductive pattern CE1 electrically connected to the first electrode material and the third conductive pattern CE3 electrically connected to the third electrode material. The ground voltage may be applied to the second conductive pattern CE2 electrically connected to the second electrode material ETL2a and the fourth conductive pattern CE4 electrically connected to the fourth electrode material. In an embodiment, the ground voltage may have a voltage level similar to that of the second power supply VSS.

If the first electrode material, the second electrode material ETL2a, the third electrode material, and the fourth electrode material are respectively supplied with corresponding voltages, a capacitance between the first electrode material and the second electrode material ETL2a, a capacitance between the second electrode material ETL2a and the third electrode material, and a capacitance between the third electrode material and the fourth electrode material may be formed at substantially a same level. Here, the words "substantially a same level" may mean a level in which a difference between a first value and a second value is less than about 5%. For example, the above-mentioned percentage value may be determined by ((first value−second value)/first value)*100(%), in case that the first value is a larger value.

The first electrode material may contact the first conductive pattern CE1, the second electrode material ETL2a may contact the second electrode pattern, the third electrode material may contact the third electrode pattern, and the fourth electrode material may contact the fourth electrode pattern, so that a surface area of each electrode material may be secured. The capacitance between the first electrode material and the second electrode material ETL2a, the capacitance between the second electrode material ETL2a and the third electrode material, and the capacitance between the third electrode material and the fourth electrode material may be formed at substantially a same level.

Therefore, the respective numbers of light emitting elements aligned between the first electrode material and the second electrode material ETL2a, between the second electrode material ETL2a and the third electrode material, and between the third electrode material and the fourth electrode material may be at a same level.

Figure 20:
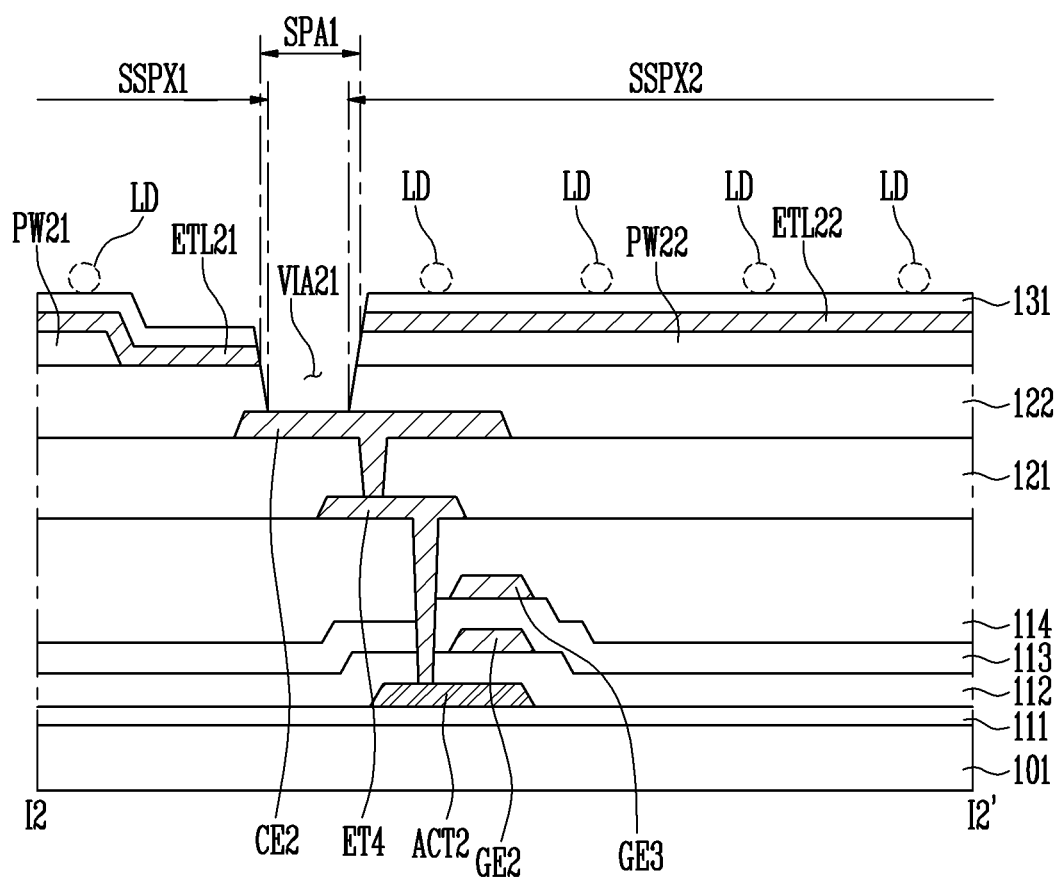

Thereafter, as illustrated in FIG. 20, the second electrode material ETL2a may be divided into parts to respectively form the second electrode ETL21 of the first unit pixel SSPX1, the second electrode ETL22 of the second unit pixel SSPX2, and the second electrode ETL23 of the third unit pixel SSPX3. The second electrodes ETL21, ETL22, and ETL23 may be separated from each other and be electrically independent from each other. The second electrode ETL21 of the first unit pixel SSPX1 and the second electrode ETL22 of the second unit pixel SSPX2 may be separated from each other so that the first separation area SPA1 may be formed. The second electrode ETL22 of the second unit pixel SSPX2 and the second electrode ETL23 of the third unit pixel SSPX3 may be separated from each other so that the second separation area SPA2 may be formed. Likewise, the third electrodes ETL31, ETL32, and ETL33 and the fourth electrodes ETL41, ETL42, and ETL43 may also be separated from each other.

Furthermore, a position at which the first separation area SPA1 is formed and a position at which the second separation area SPA2 is formed may overlap the positions at which the existing opening holes VIA21, VIA22, VIA31, VIA32, VIA41, and VIA42 are formed. Hence, the second electrode material ETL2a and the second conductive pattern CE2, the third electrode material and the third conductive pattern CE3, and the fourth electrode material and the fourth conductive pattern CE4 that have contacted each other may be electrically separated from each other.

Even through the first separation area SPA1 and the second separation area SPA2 are formed, the first electrode material may become the first electrode ETL1 without being divided.

Figure 21:
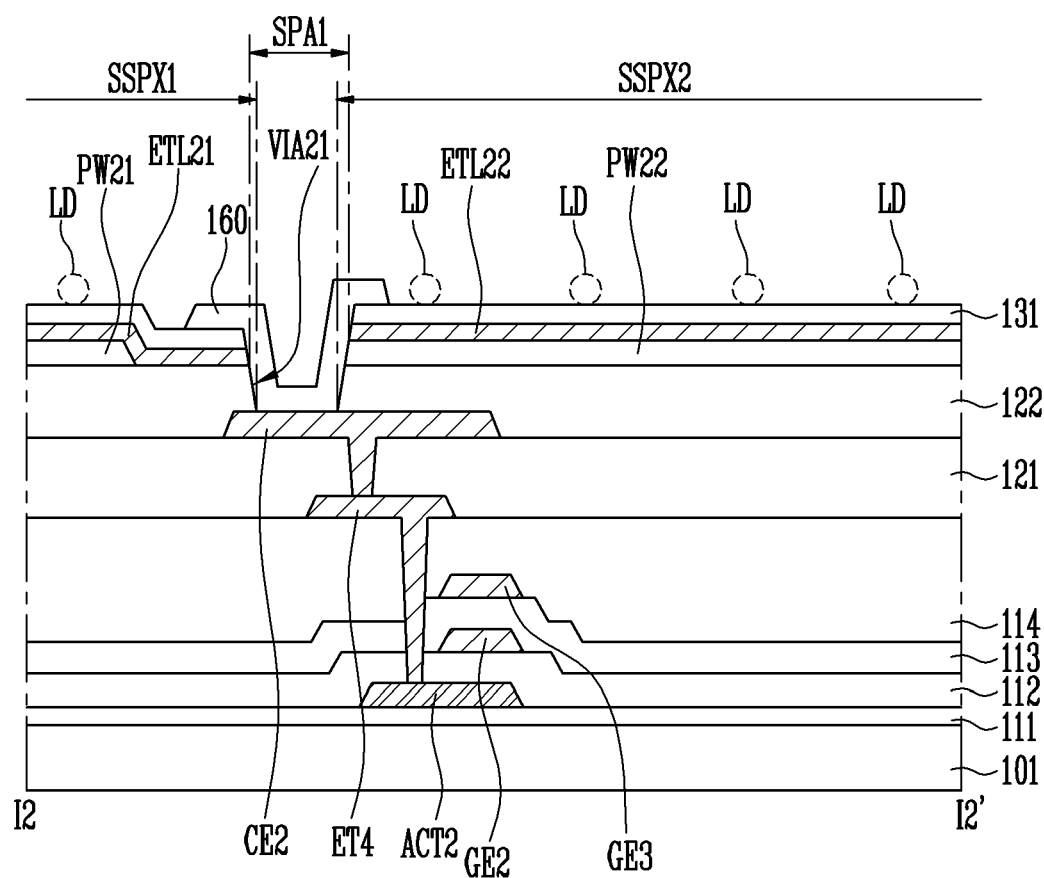

Thereafter, as illustrated in FIG. 21, the fourth insulating layer 160 (and/or the second insulating layer 132) may be formed. The fourth insulating layer 160 may be formed to over the first separation area SPA1 and the second separation area SPA2.

Subsequently, although not clearly illustrated, the first to fourth contact electrodes CNE1 to CNE4, the third insulating layer 141, and the thin-film encapsulation layer 151 may be formed in sequence.

A display device in accordance with another embodiment will be described. Hereinafter, description of the same components as those illustrated in FIGS. 1 to 21 will be omitted herein, and the same or similar reference numerals are used.

Figure 22:
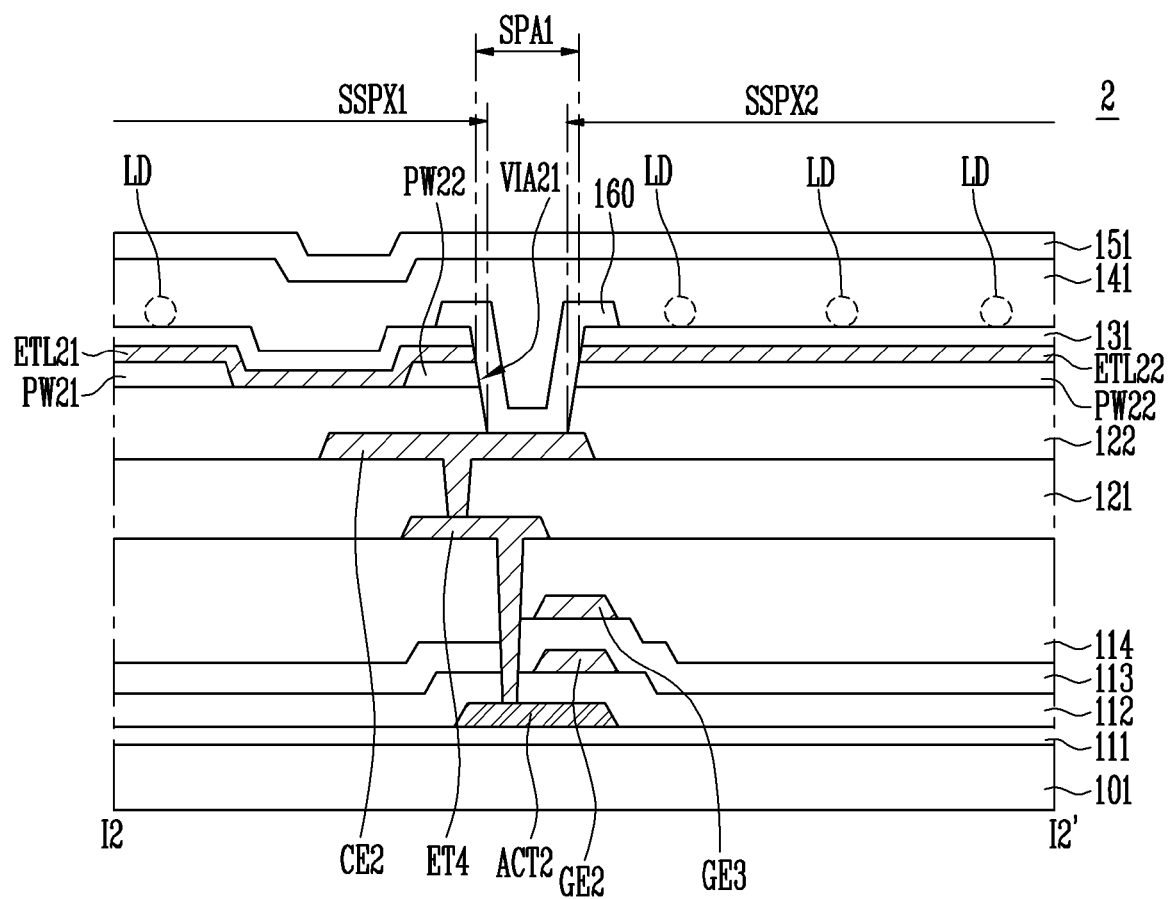
FIG. 22 is a schematic cross-sectional view illustrating a display device in accordance with an embodiment.
Figure 23:
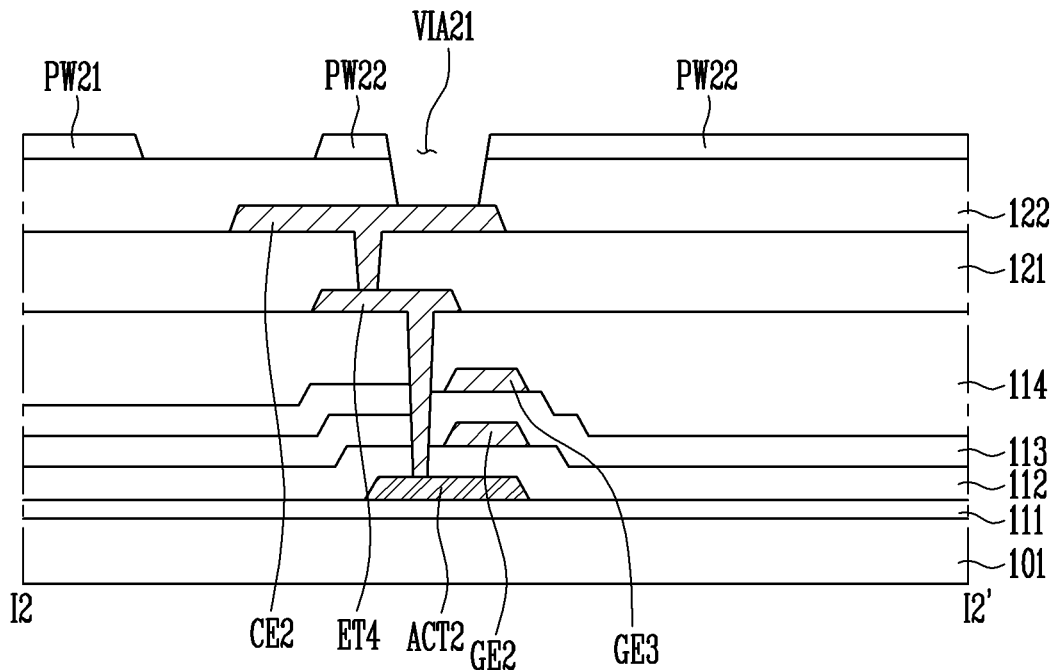
FIGS. 23 and 24 are schematic cross-sectional views illustrating some of the steps of manufacturing the display device of FIG. 22.
Figure 24:
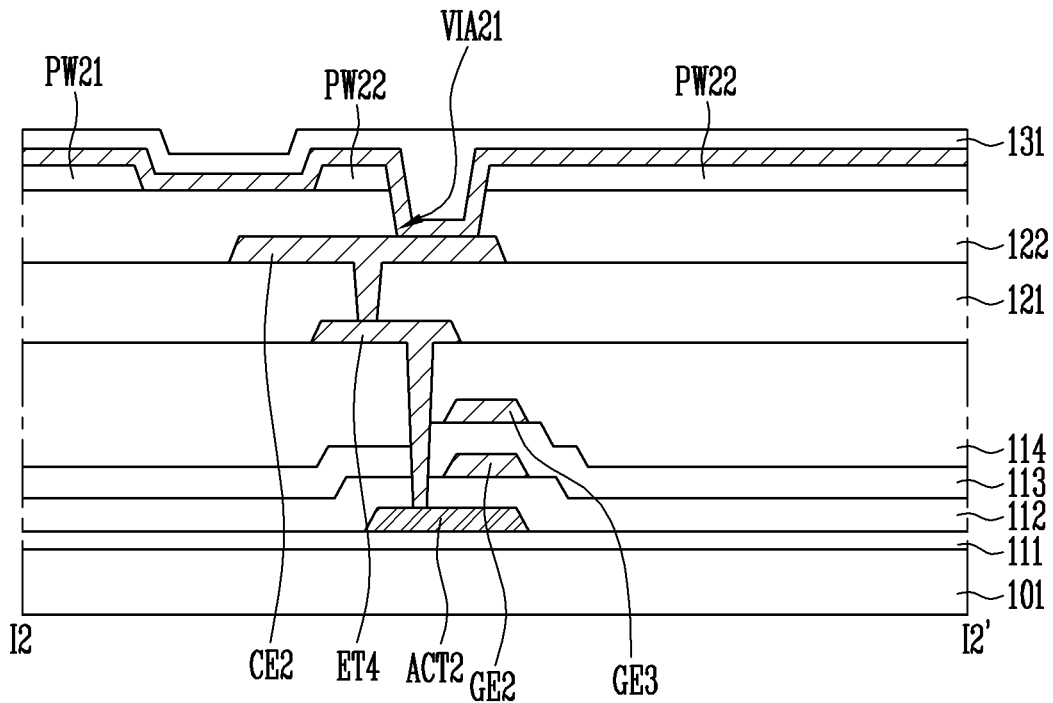

FIG. 22 is a schematic cross-sectional view illustrating a display device in accordance with an embodiment. FIGS. 23 and 24 are schematic cross-sectional views illustrating some or a number of the steps of manufacturing the display device, 2b and 2c, respectively, of FIG. 22. FIGS. 22 to 24 illustrate a modification example of FIG. 13, and are diagrams corresponding to a cross-section taken along line I2-I2'.

Referring to FIGS. 22 to 24, the display device 2 in accordance with an embodiment is different from the display device 1 in accordance with an embodiment of FIGS. 15, 17, and 18 in that the opening hole VIA21 may pass through a partition wall (for example, PW22).

The opening hole VIA21 may be formed through the partition wall PW22. In an embodiment, the separation area SPA1 that overlaps the opening hole VIA21 may divide the partition wall PW22 into parts.

Figure 25:
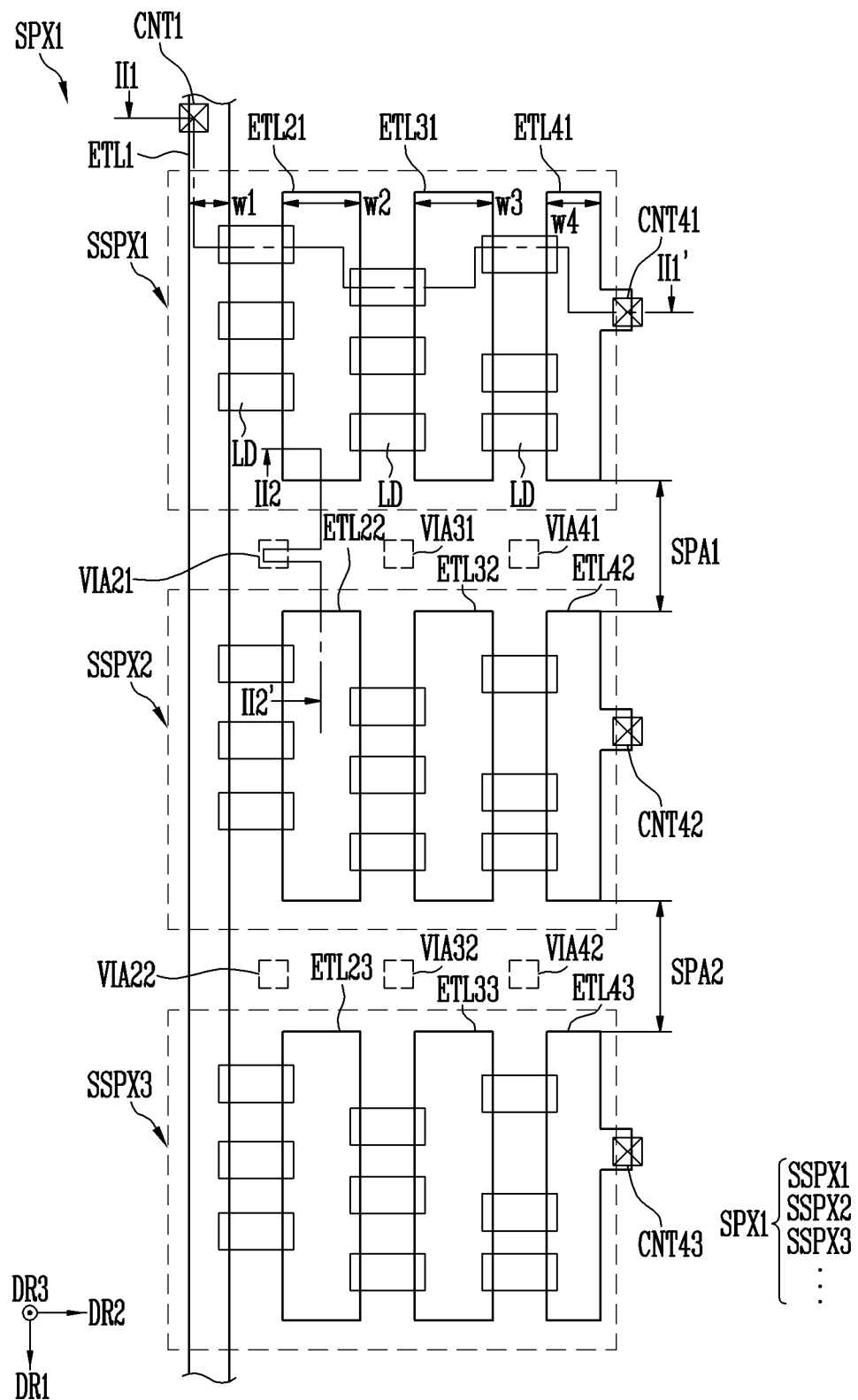
FIG. 25 is a schematic plan view diagram illustrating arrangement of part of a sub-pixel included in a display device in accordance with an embodiment.
Figure 26:
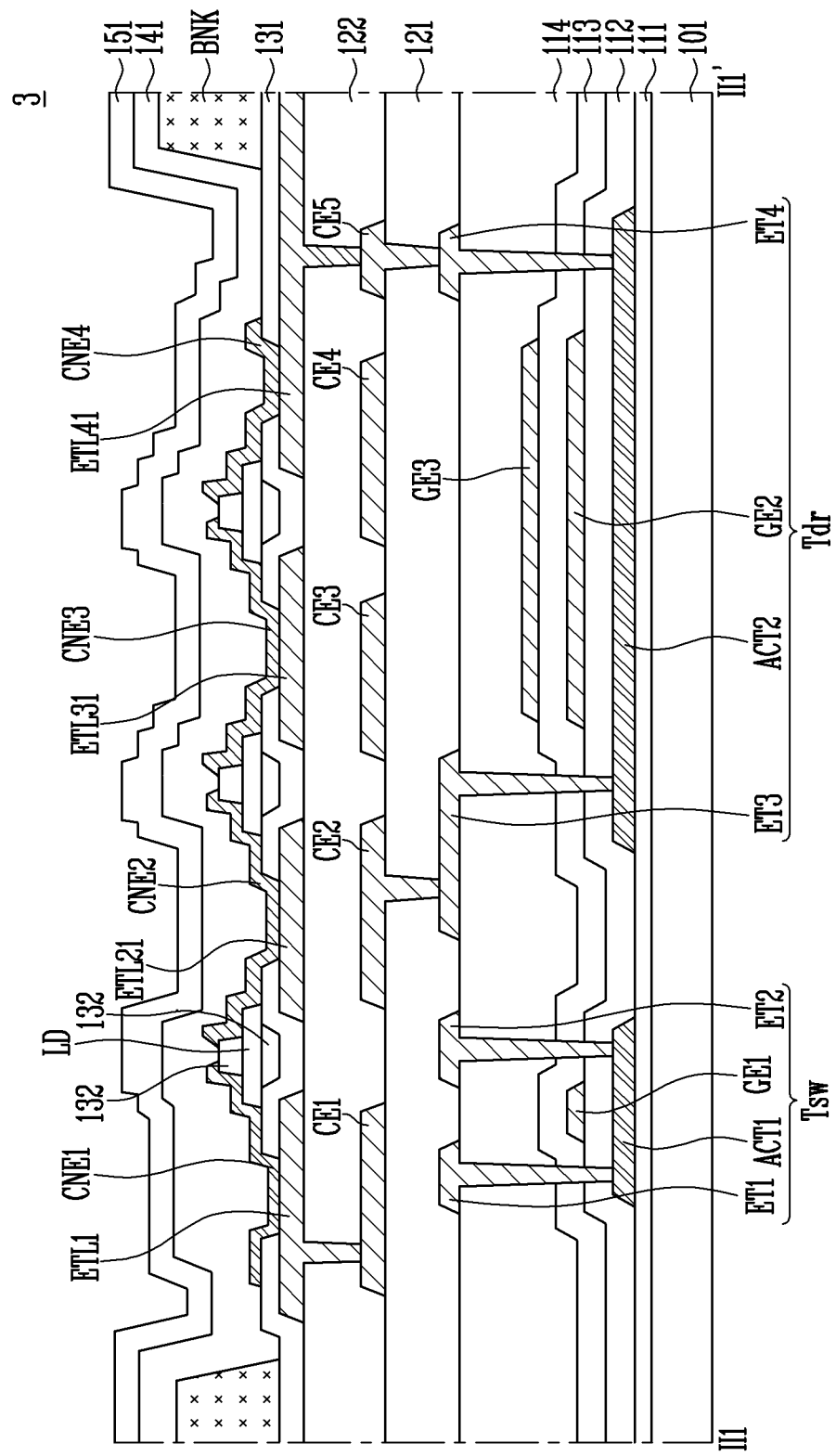
FIG. 26 is a schematic cross-sectional view of the display device taken along line II1-II1' of FIG. 25.
Figure 27:
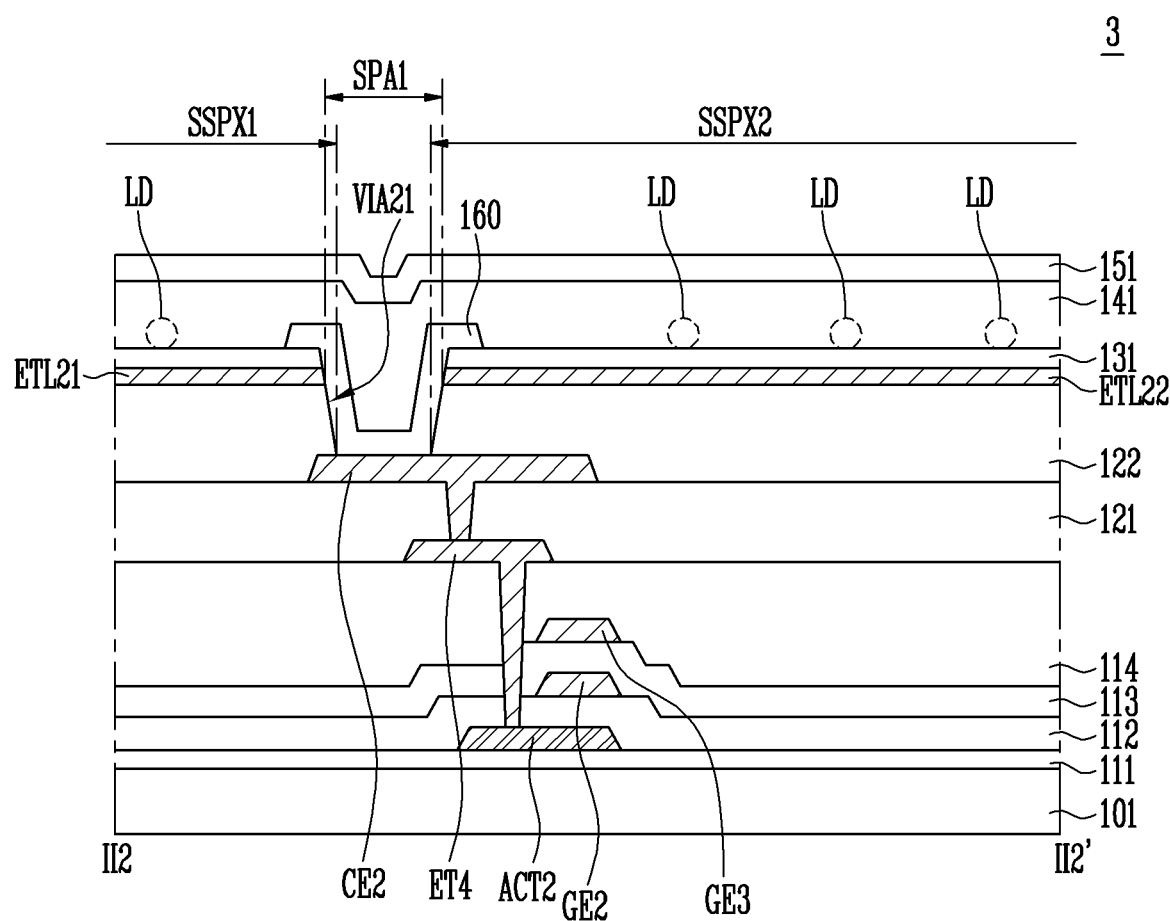
FIG. 27 is a schematic cross-sectional view of the display device taken along line II2-II2' of FIG. 25.

FIG. 25 is a schematic plan view diagram illustrating arrangement of part of a sub-pixel included in a display device in accordance with still another embodiment. FIG. 26 is a schematic cross-sectional view of the display device taken along line II1-II1' of FIG. 25. FIG. 27 is a schematic cross-sectional view of the display device taken along line II2-II2' of FIG. 25.

Referring to FIGS. 25 to 27, the display device 3 in accordance with an embodiment is different from the display device 1 in accordance with an embodiment of FIGS. 13 to 15 in that the partition walls may be omitted.

In an embodiment, in the display device 3, the partition walls may be omitted.

Figure 28:
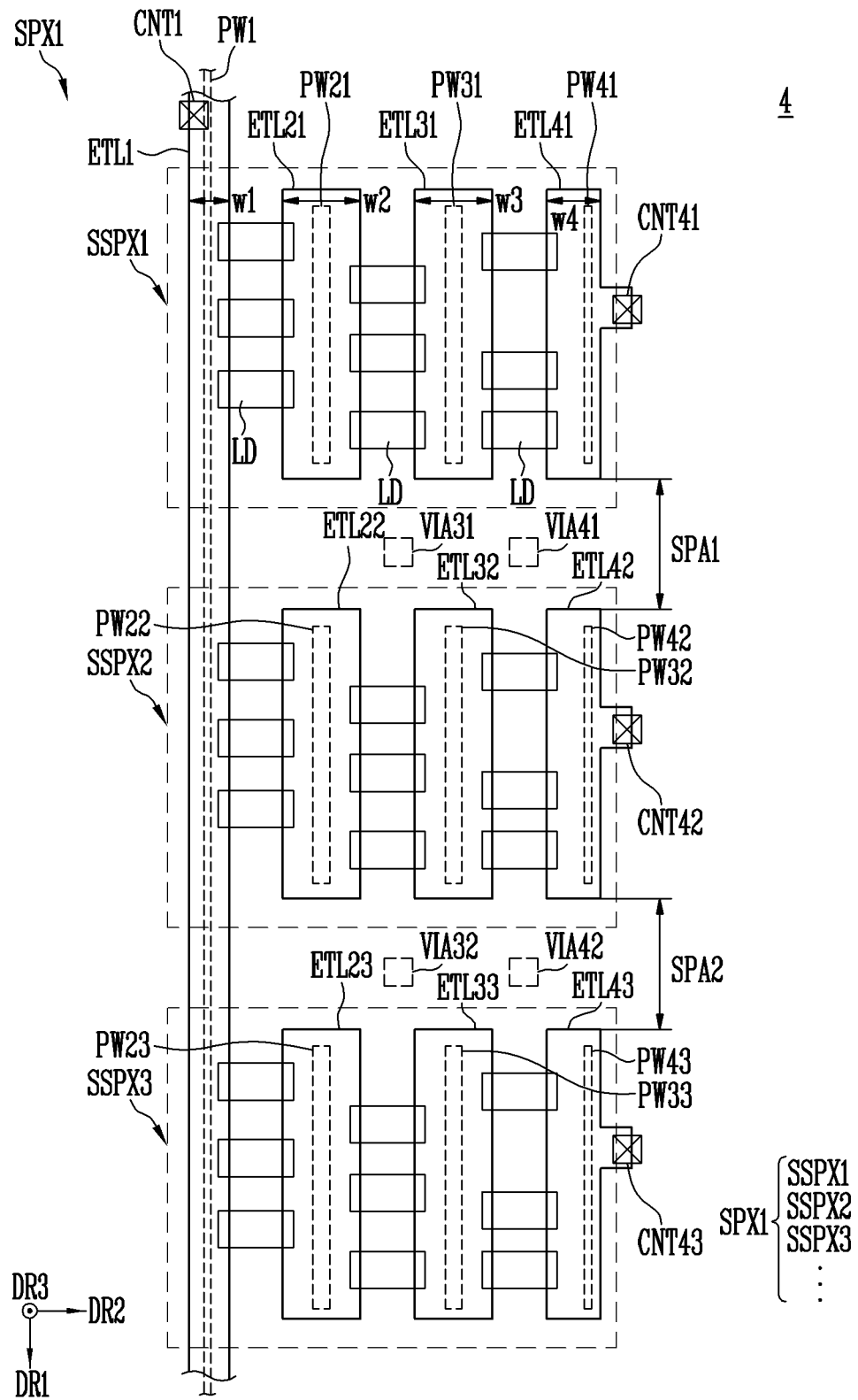
FIG. 28 is a schematic plan view diagram illustrating arrangement of part of a sub-pixel included in a display device in accordance with an embodiment.
Figure 29:
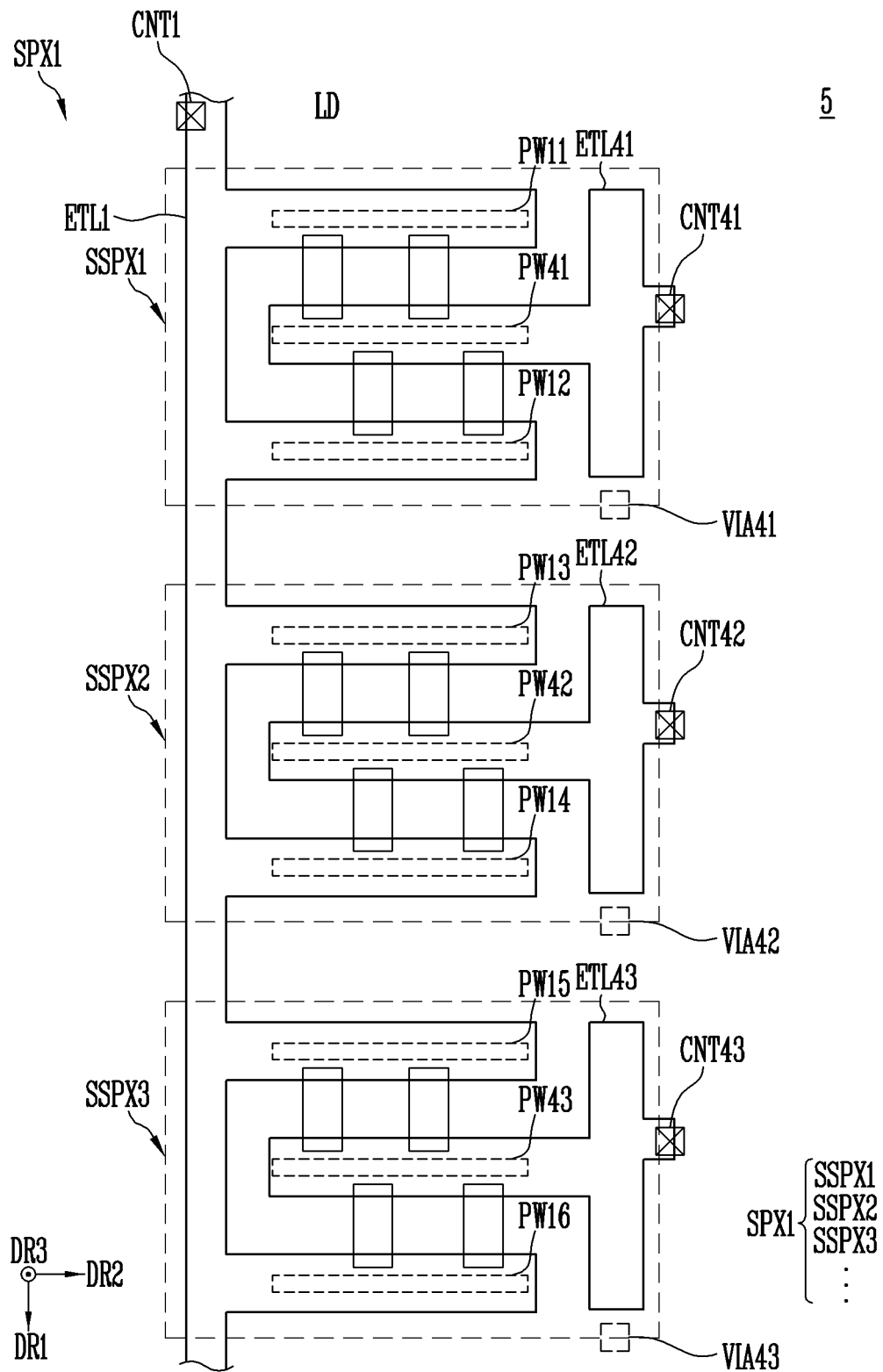
FIG. 29 is a schematic plan view diagram illustrating arrangement of part of a sub-pixel included in a display device in accordance with an embodiment.

FIG. 28 is a schematic plan view diagram illustrating arrangement of part of a sub-pixel included in a display device in accordance with an embodiment.

Referring to FIG. 28, the display device 4 in accordance with an embodiment is different from the display device 1 in accordance with an embodiment of FIG. 13 in that some or a number of the opening holes may be omitted.

Some or a number of the opening holes (VIA21, VIA22, VIA31, VIA32, VIA41, and VIA42 of FIG. 13) that are provided between the respective adjacent second electrodes ETL21, ETL22, and ETL23, the respective third electrodes ETL31, ETL32, and ETL33, and the respective fourth electrodes ETL41, ETL42, and ETL43 may be omitted. In an embodiment, there is illustrated an example in which the opening holes (VIA21 and VIA22 of FIG. 13) provided between the respective adjacent second electrodes ETL21, ETL22, and ETL23 are omitted.

In an embodiment, opening holes VIA31, VIA32, VIA41, and VIA42 may be provided between the respective adjacent third electrodes ETL31, ETL32, and ETL33 and between the respective fourth electrodes ETL41, ETL42, and ETL43.

During a process of manufacturing the display device 4, as needed, the opening holes VIA31, VIA32, VIA41, and VIA42 may be formed, the third electrode material and the third electrode pattern may contact each other, and the fourth electrode material and the fourth electrode pattern may contact each other, and thereafter, the light emitting elements LD may be aligned. A capacitance between the first electrode material and the second electrode material, a capacitance between the second electrode material and the third electrode material, and a capacitance between the third electrode material and the fourth electrode material may be formed at substantially a same level. Hence, the numbers of light emitting elements respectively aligned between the first electrode material and the second electrode material, between the second electrode material and the third electrode material, and between the third electrode material and the fourth electrode material may be at a same level.

The embodiment is not limited thereto. The opening holes (VIA21 and VIA22 of FIG. 13) may be provided between the respective adjacent second electrodes ETL21, ETL22, and ETL23. The opening holes VIA31, VIA32, VIA41, and VIA42 that are provided between the respective adjacent third electrodes ETL31, ETL32, and ETL33 and the respective fourth electrodes ETL41, ETL42, and ETL43 may be omitted.

FIG. 29 is a schematic plan view diagram illustrating arrangement of part of a sub-pixel included in a display device in accordance with an embodiment.

Referring to FIG. 29, the display device 5 in accordance with an embodiment is different from the display device 1 in accordance with the embodiment of FIG. 13 in that the light emitting elements LD may be connected in parallel to each other.

In an embodiment, the light emitting elements LD may be connected in parallel to each other. Hence, the island electrode described above may be omitted. In other words, in the embodiment of FIG. 13, the second electrodes (ETL21, ETL22, and ETL23 of FIG. 13) and the third electrodes (ETL31, ETL32, and ETL33 of FIG. 13) may be omitted.

The first electrode ETL1 and the fourth electrodes ETL41, ETL42, and ETL43 each may include a stem electrode extending in the first direction DR1 to secure space for alignment of the light emitting elements LD, and branch electrodes extending in a direction facing each other. The respective branch electrodes of the first electrode ETL1 and the fourth electrodes ETL41, ETL42, and ETL43 may extend in the second direction DR2 to face each other. The respective branch electrodes of the first electrode ETL1 and the fourth electrodes ETL41, ETL42, and ETL43 may be spaced apart from each other in the first direction DR1. In each unit pixel SSPX1, SSPX2, and SSPX3, the branch electrodes extending from the first electrode ETL1 and the branch electrodes extending from the fourth electrodes ETL41, ETL42, and ETL43 may alternate each other.

During a process of manufacturing the display device 5, as needed, the opening holes VIA41 and VIA42 may be formed, and the fourth electrode material and the fourth electrode patterns may contact each other, and thereafter, the light emitting elements LD may be aligned.

Figure 30:
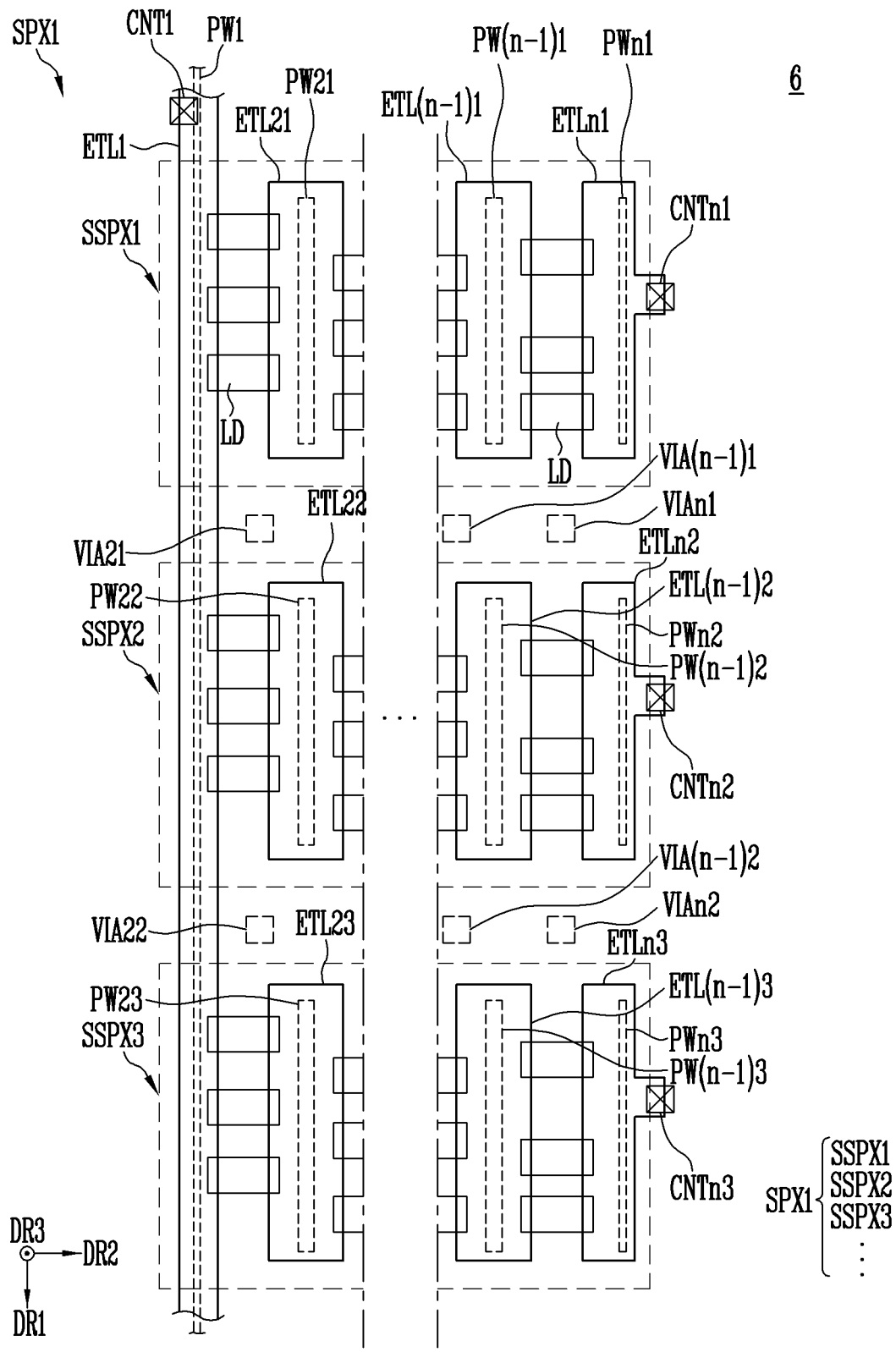
FIG. 30 is a schematic plan view diagram illustrating arrangement of part of a sub-pixel included in a display device in accordance with an embodiment.

FIG. 30 is a schematic plan view diagram illustrating arrangement of part of a sub-pixel included in a display device in accordance with an embodiment.

Referring to FIG. 30, the display device 6 in accordance with an embodiment is different from the display device 1 in accordance with an embodiment of FIG. 13 in that the display device 6 may include at least three or more island electrodes.

In an embodiment, in each unit pixel SSPX1, SSPX2, and SSPX3, the second electrodes ETL21, ETL22, and ETL23 to n-th electrodes ETLn1, ETLn2, and ETLn3 may be disposed at positions spaced apart from each other.

In an embodiment, the n-th electrodes ETLn1, ETLn2, and ETLn3 may have a function corresponding to that of the fourth electrodes of FIG. 13 (ETL41, ETL42, and ETL43 of FIG. 13). The n-1-th electrodes ETL(n-1)1, ETL(n-1)2, and ETL(n-1)3 may have a function corresponding to that of the third electrodes of FIG. 13 (ETL31, ETL32, and ETL33 of FIG. 13).

Opening holes VIA(n-1)1, VIA(n-1)2, VIAn1, and VIAn2 may be provided between the respective adjacent n-th electrodes ETLn1, ETLn2, and ETLn3 and between the respective n-1-th electrodes ETL(n-1)1, ETL(n-1)2, and ETL(n-1)3. It is to be understood that FIG. 30 further includes partition walls, PWn1, PWn2, PWn3, PW(n-1)1, PW(n-1)2 and PW(n-1)3 and contact holes, CNTn1, CNTn2 and CNTn3 but is not limited thereto.

Although embodiments have been disclosed, those skilled in the art will appreciate that the disclosure may be implemented in other forms, without departing from the scope and spirit of the disclosure as disclosed in the accompanying claims. Therefore, it should be understood that embodiments are only for illustrative purpose and do not limit the scope of the disclosure.

What is claimed is:

1. A display device comprising:
    transistors disposed on a substrate, each of the transistors including a semiconductor pattern, source and drain electrodes electrically connected to the semiconductor pattern, and a gate electrode;
    a first protective layer disposed on the transistors and covering the transistors;
    conductive patterns disposed on the first protective layer;
    a second protective layer disposed on the conductive patterns;
    a first electrode and a second electrode disposed on an identical layer as each other, wherein the first electrode and the second electrode are disposed on the second protective layer, and the first electrode and the second electrode are spaced apart from each other;
    at least one light emitting element disposed between the first electrode and the second electrode;
    a first contact electrode disposed on the first electrode and electrically contacting an end of the at least one light emitting element; and
    a second contact electrode disposed on the second electrode and electrically contacting another end of the at least one light emitting element, wherein the conductive patterns comprise:
    a first conductive pattern overlapping with the first electrode in a thickness direction of the display device; and
    a second conductive pattern overlapping with the second electrode in the thickness direction of the display device,
    the first electrode is electrically connected to the first conductive pattern through a contact hole passing through the second protective layer,
    the second protective layer includes an opening hole exposing at least a portion of the second conductive pattern,
    the first electrode directly contacts the first conductive pattern through the contact hole, and
    the second electrode is insulated from the second conductive pattern.

2. The display device according to claim 1, wherein the second conductive pattern is directly connected to the source electrode or the drain electrode of at least one of the transistors through another contact hole passing through the first protective layer.

3. The display device according to claim 1, wherein
    a first power voltage is applied to the first electrode, and
    a second power voltage that is a higher potential power voltage than the first power voltage is applied to the second electrode.

4. The display device according to claim 3, wherein
    the first electrode and the second electrode each extend in a first direction, and
    an extension length of the first electrode is greater than an extension length of the second electrode.

5. The display device according to claim 4, wherein
    the second electrode electrically connected to the first electrode by the at least one light emitting element comprises second electrodes, and
    the opening hole is disposed between the second electrodes.

6. The display device according to claim 1, further comprising:
    a first bank disposed between the second protective layer and the first electrode; and
    a second bank disposed between the second protective layer and the second electrode,
    wherein the first bank and the second bank each have a shape protruding from an upper surface of the second protective layer in the thickness direction.

7. The display device according to claim 6, wherein
    the first electrode covers the first bank, and
    the second electrode covers the second bank.

8. The display device according to claim 7, wherein the opening hole is adjacent to the second bank.

9. The display device according to claim 7, wherein the opening hole passes through the second bank.

10. A display device comprising:
    transistors disposed on a substrate, each of the transistors including a semiconductor pattern, source and drain electrodes electrically connected to the semiconductor pattern, and a gate electrode;
    a first protective layer disposed on the transistors and covering the transistors;
    conductive patterns disposed on the first protective layer;
    a second protective layer disposed on the conductive patterns;
    a first electrode and a second electrode disposed on an identical layer as each other, wherein the first electrode and the second electrode are disposed on the second protective layer, and the first electrode and the second electrode are spaced apart from each other;

at least one light emitting element disposed between the first electrode and the second electrode;

a first contact electrode disposed on the first electrode and electrically contacting an end of the at least one light emitting element; and a second contact electrode disposed on the second electrode and electrically contacting another end of the at least one light emitting element, wherein the conductive patterns comprise:
- a first conductive pattern overlapping with the first electrode in a thickness direction of the display device; and
- a second conductive pattern overlapping with the second electrode in the thickness direction of the display device, the first electrode is electrically connected to the first conductive pattern through a contact hole passing through the second protective layer, the second protective layer includes an opening hole exposing at least a portion of the second conductive pattern, the display device further comprises a first island electrode, the first island electrode, the first electrode, and the second electrode are disposed on an identical layer as each other, and the first island electrode is disposed between the first electrode and the second electrode.

11. The display device according to claim 10, wherein the at least one light emitting element are disposed between the first electrode and the first island electrode and between the first island electrode and the second electrode.

12. The display device according to claim 11, wherein a difference between a number of the at least one light emitting element disposed between the first electrode and the first island electrode and a number of the at least one light emitting element disposed between the first island electrode and the second electrode is less than about 5%.

13. The display device according to claim 10, wherein the conductive patterns comprise a third conductive pattern overlapping the first island electrode in the thickness direction of the display device.

14. The display device according to claim 13, wherein the second protective layer includes another opening hole exposing at least a portion of the third conductive pattern, and the first island electrode is insulated from the third conductive pattern.

15. The display device according to claim 10, further comprising:

a second island electrode, wherein the second island electrode, the first electrode, the second electrode, and the first island electrode are disposed on an identical layer as each other, and the second island electrode is disposed between the first island electrode and the second electrode.

16. The display device according to claim 15, wherein a width of each of the first electrode and the second electrode is less than a width of each of the first island electrode and the second island electrode.

17. The display device according to claim 10, wherein the light emitting elements are electrically connected in series and parallel.

18. A method of manufacturing a display device comprising:

forming banks spaced apart from each other on a protective layer;

forming an opening hole to expose at least a portion of one of a plurality of conductive patterns;

forming electrode materials on the banks such that the electrode materials electrically contact the conductive patterns through the opening hole, and forming an insulating material on the electrode materials;

aligning light emitting elements on the insulating material such that the light emitting elements are disposed between the conductive patterns; and forming a separation area after the aligning, the separation area separating a part of the electrode materials into parts.

19. The method according to claim 18, further comprising:

forming transistors on a substrate prior to the forming of the banks and prior to the forming of the opening hole, each of the transistors includes a semiconductor pattern, source and drain electrodes electrically connected to the semiconductor pattern, and a gate electrode.

20. The method according to claim 19, wherein the separation area overlaps the opening hole in a thickness direction of the display device.

21. The method according to claim 20, further comprising:

forming an insulating layer to cover the opening hole.

22. The method according to claim 19, wherein, in forming the separation area, the part of the electrode materials do not electrically contact the conductive patterns, and another part of the electrode materials that are not separated electrically contact the conductive patterns.

23. The method according to claim 18, wherein the electrode materials comprise a first electrode material, a second electrode material, a third electrode material, and a fourth electrode material which extend in a first direction, and the conductive patterns comprise a first conductive pattern overlapping the first electrode material in a thickness direction of the display device, a second conductive pattern overlapping the second electrode material in the thickness direction of the display device, a third conductive pattern overlapping the third electrode material in the thickness direction of the display device, and a fourth conductive pattern overlapping the fourth electrode material in the thickness direction of the display device.

24. The method according to claim 23, wherein in aligning the light emitting elements, the light emitting elements are aligned between the first conductive pattern and the second conductive pattern, between the second conductive pattern and the third conductive pattern, and between the third conductive pattern and the fourth conductive pattern, and a difference between a number of light emitting elements aligned between the first conductive pattern and the second conductive pattern, a number of light emitting elements aligned between the second conductive pattern and the third conductive pattern, and a number of light emitting elements aligned between the third conductive pattern and the fourth conductive pattern is less than about 5%.

25. The method according to claim 23, wherein, in aligning the light emitting elements, a difference between capacitances between the first conductive pattern and the second conductive pattern, between the second conductive pattern and the third conductive pattern, and between the third conductive pattern and the fourth conductive pattern is less than about 5%.

26. The method according to claim 23, wherein, in aligning the light emitting elements,
    an AC voltage is applied to the first conductive pattern and the third conductive pattern, and
    a ground voltage is applied to the second conductive pattern and the fourth conductive pattern.

* * * * *